United States Patent
Scott et al.

(10) Patent No.: US 12,105,538 B2
(45) Date of Patent: Oct. 1, 2024

(54) PRESSURE REGULATOR ASSEMBLY FOR A COOLANT DISTRIBUTION UNIT

(71) Applicant: HEWLETT PACKARD ENTERPRISE DEVELOPMENT LP, Spring, TX (US)

(72) Inventors: Michael Scott, Chippewa Falls, WI (US); Harvey J. Lunsman, Chippewa Falls, WI (US); David Collins, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 161 days.

(21) Appl. No.: 17/821,028

(22) Filed: Aug. 19, 2022

(65) Prior Publication Data
US 2024/0061453 A1     Feb. 22, 2024

(51) Int. Cl.
*F15B 1/02*      (2006.01)
*F15B 1/027*     (2006.01)
(Continued)

(52) U.S. Cl.
CPC ........... *G05D 16/109* (2019.01); *F15B 1/021* (2013.01); *F15B 1/025* (2013.01); *F15B 1/027* (2013.01); *F15B 1/033* (2013.01); *F15B 1/24* (2013.01); *F15B 21/006* (2013.01); *H05K 7/20272* (2013.01); *H05K 7/20281* (2013.01); *F15B 2201/31* (2013.01); *F15B 2201/32* (2013.01); *F15B 2201/413* (2013.01); *F16L 55/052* (2013.01); *F16L 55/053* (2013.01)

(58) Field of Classification Search
CPC .......... F15B 1/021; F15B 1/025; F15B 1/027; F15B 1/033; F15B 1/24; F15B 21/006; F15B 2201/31; F15B 2201/32; F15B 2201/413; F16L 55/052; F16L 55/053
USPC .......................................................... 138/31
See application file for complete search history.

(56) References Cited

U.S. PATENT DOCUMENTS 742,511 A  * 10/1903 Stebbins ................... E03B 7/10
                                                                  138/27
3,015,345 A    1/1962 Michael
(Continued)

FOREIGN PATENT DOCUMENTS

GB          2009872 A  *  6/1979  .............. F16L 27/12

*Primary Examiner* — Kenneth Bomberg
*Assistant Examiner* — Matthew Wiblin
(74) *Attorney, Agent, or Firm* — Hewlett Packard Enterprise Patent Department

(57) ABSTRACT

Example implementations relate to a pressure regulator assembly for a closed fluid loop of a CDU. The pressure regulator assembly has a cylinder having an internal volume, and first and second hollow pistons slidably connected to the cylinder to split the internal volume into a first volume portion having cooling fluid, a second volume portion having driver fluid, and a third volume portion having compressible matter. The first volume portion is fluidically connected to the closed fluid loop. The first hollow piston is reciprocated by the compressible matter to maintain operating pressure of the cooling fluid in the closed fluid loop. The second hollow piston is driven by the driver fluid in response to predefined pressure drop of the cooling fluid during predefined time period, to inject additional cooling fluid from the first volume portion into the closed fluid loop to restore pressure level of cooling fluid to operating pressure.

20 Claims, 8 Drawing Sheets

(51) Int. Cl.
*F15B 1/033* (2006.01)
*F15B 1/24* (2006.01)
*F15B 21/00* (2006.01)
*G05D 16/10* (2006.01)
*H05K 7/20* (2006.01)
*F16L 55/052* (2006.01)
*F16L 55/053* (2006.01)

(56) References Cited

U.S. PATENT DOCUMENTS

| | | | |
|---|---|---|---|
| 3,559,727 A | | 2/1971 | Hill et al. |
| 4,644,976 A | * | 2/1987 | Peter .................. F15B 1/24 |
| | | | 73/239 |
| 8,448,433 B2 | | 5/2013 | McBride et al. |
| 8,857,167 B2 | | 10/2014 | Johnson et al. |
| 9,549,488 B2 | | 1/2017 | Zeighami et al. |
| 2015/0020511 A1 | * | 1/2015 | Hand ................. E02F 9/2296 |
| | | | 60/327 |
| 2015/0167698 A1 | * | 6/2015 | Condon ................. F15B 1/24 |
| | | | 138/31 |
| 2020/0407946 A1 | * | 12/2020 | Kondo ................. F15B 21/14 |
| 2021/0276738 A1 | * | 9/2021 | Kim ..................... B64G 1/58 |
| 2022/0057123 A1 | * | 2/2022 | Tokeshi ................ F04B 23/02 |
| 2023/0341072 A1 | * | 10/2023 | Soder .................. F16L 55/053 |

* cited by examiner

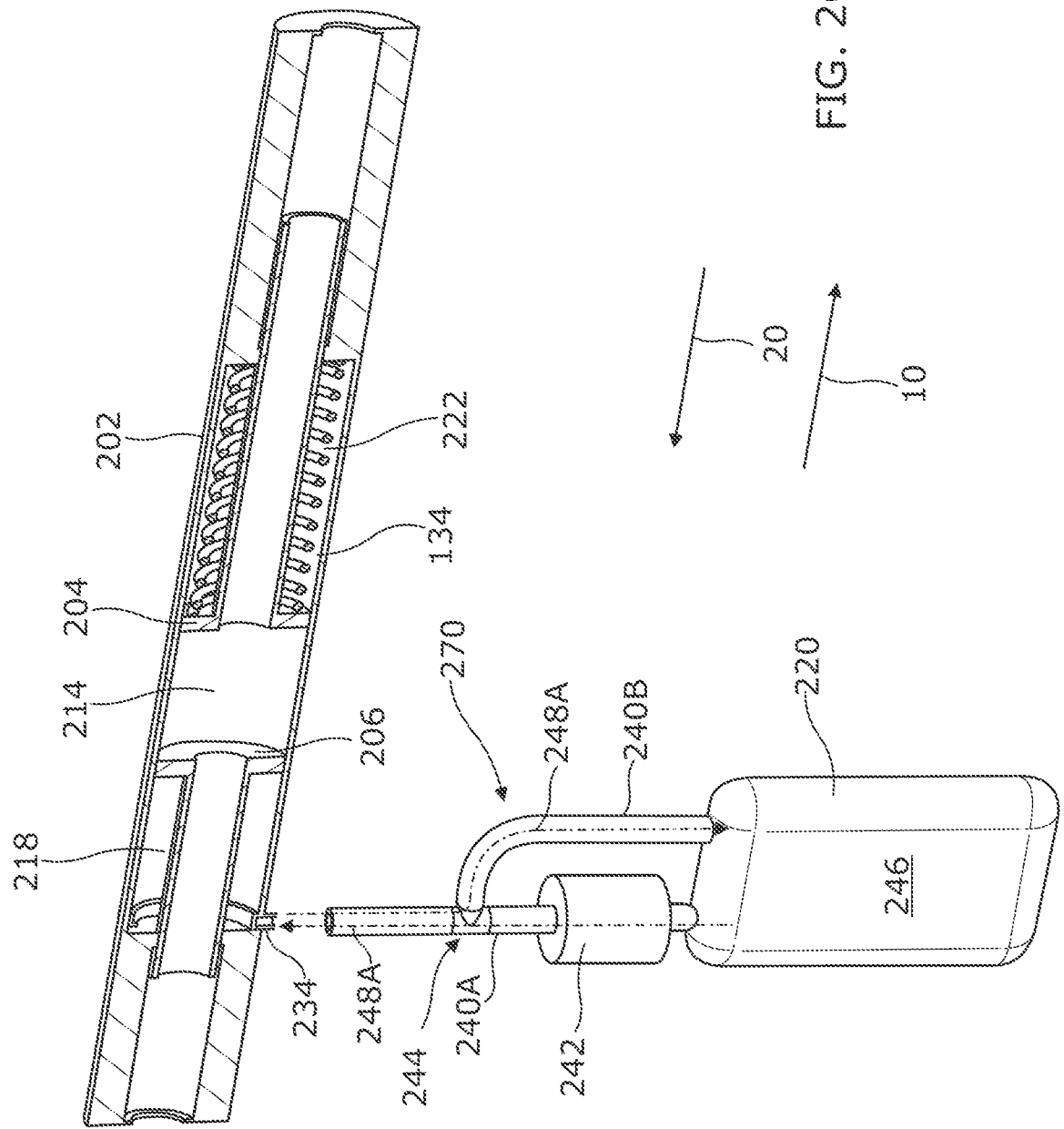

PRESSURE REGULATOR ASSEMBLY FOR A COOLANT DISTRIBUTION UNIT

BACKGROUND

Electronic devices such as computers, networking devices, power supply units, etc., generate heat when in use. Cooling systems may be utilized to remove heat from components of the electronic devices to keep them within desired operating temperatures. For example, some cooling systems may use a coolant distribution unit (CDU) with one or more circulation pumps to circulate a cooling fluid in a closed fluid loop to remove heat from components of the electronic devices.

BRIEF DESCRIPTION OF THE DRAWINGS

Various examples will be described below with reference to the following figures.

FIG. 2C illustrates a perspective view of the pressure regulator assembly of FIG. 2B connected to a driver fluid assembly according to an example implementation of the present disclosure.

DETAILED DESCRIPTION

Figure 1:
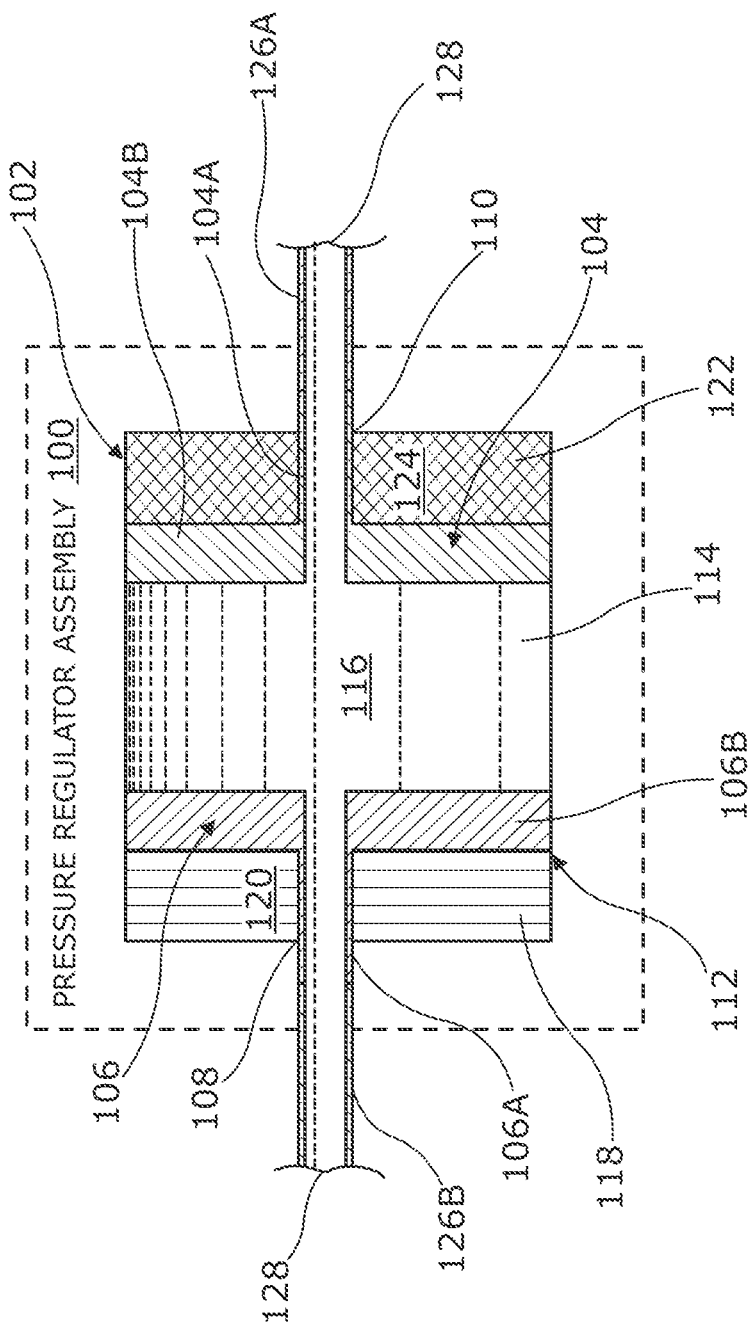
FIG. 1 illustrates a block diagram of a pressure regulator assembly according to an example implementation of the present disclosure.

The following detailed description refers to the accompanying drawings. For purposes of explanation, certain examples are described with reference to the components illustrated in FIGS. 1-6. The functionality of the illustrated components may overlap, however, and may be present in a fewer or greater number of elements and components. Moreover, the disclosed examples may be implemented in various environments and are not limited to the illustrated examples. Further, the sequence of operations described in connection with FIG. 6 is an example and is not intended to be limiting. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

As used herein, "operating pressure" may refer to a pressure at which a cooling fluid is circulated in a closed fluid loop of a coolant distribution unit (CDU), by a circulation pump. As used herein "predefined pressure" may refer to a threshold pressure of the cooling fluid at an inlet of the circulation pump to circulate the cooling fluid at the operating pressure in the closed fluid loop. As used herein "minimum threshold pressure" may refer to a minimum pressure of the cooling fluid at an inlet of the circulation pump that is required to circulate the cooling fluid at the operating pressure in the closed fluid loop. As used herein "predefined time" may refer to a threshold time period that the circulation pump can receive the cooling fluid at a predefined pressure and pump the cooling fluid at an operating pressure in the closed fluid loop. As used herein, "predefined volume level" may refer to a threshold volume level an internal volume of the cylinder that may be used for holding the cooling fluid. As used herein, "maximum threshold volume level" may refer to a maximum portion of the internal volume of the cylinder that may be used for holding the cooling fluid. As used herein, "minimum threshold volume level" may refer to a minimum portion of the internal volume of the cylinder which is required to hold the cooling fluid and maintain the operating pressure of the cooling fluid in the closed fluid loop. As used herein, "fluidically connected" refers to two or more components connected in an appropriate manner such that a fluid or a least a portion of a fluid can directly or indirectly pass or flow from one component to another component.

In the case of cooling systems including a CDU which circulates a cooling fluid in a closed fluid loop, the cooling fluid may undergo pressure (e.g., operating pressure) variations due to pressure spikes and/or thermal expansion and contraction of the cooling fluid. Such variations in the operating pressure may cause cavitation in one or more circulation pumps, resulting in pump damage. Additionally, the CDU may tend to lose some portion of the cooling fluid over time due to evaporation within the closed fluid loop and/or dripping from one or more plumbing joints in the CDU. Accordingly, such loss of the cooling fluid may also gradually decrease the operating pressure of the cooling fluid in the closed fluid loop. When the operating pressure drops below a predefined pressure during a predefined time, it may also cause cavitation in one or more circulation pumps, resulting in pump damage. Further, cavitation may also occur at certain pressure points in the plumbing, resulting in damage to the plumbing, thus leading to premature CDU failure.

To address the issues related to pressure variations of cooling fluid in a closed fluid loop of a CDU, some cooling systems may include an accumulator in the CDU, to regulate operating pressure variations of the cooling fluid. For example, an accumulator connected to the closed fluid loop may provide pressure relief in response to pressure spikes and/or thermal expansion and contraction of the cooling fluid to regulate the pressure variations. Accordingly, the accumulator may assist the cooling fluid to maintain the operating pressure in the closed fluid loop. The accumulator may generally have a stored volume of working fluid (e.g., cooling fluid) in its internal volume at the operating pressure. In such case, the accumulator, which is connected to the closed fluid loop, may push a portion of the stored cooling fluid into the closed fluid loop and/or pull a portion of the cooling fluid from the closed fluid loop to regulate the pressure variations in the closed fluid loop.

Similarly, to address the issues related to loss of cooling fluid in a closed fluid loop of a CDU, some cooling systems may include a fluid reservoir in the CDU, to inject some portion of the cooling fluid into the closed fluid loop when the operating pressure drops below a predefined pressure during a predefined time period to return the pressure level to the operating pressure. Accordingly, the fluid reservoir having the stored volume of the cooling fluid may be fluidically connected to the closed fluid loop to inject some portion of the stored cooling fluid into the closed fluid loop.

However, for such cooling systems, since cooling fluid circulated in a closed fluid loop of a CDU may not frequently undergo pressure variations, the stored cooling fluid in an accumulator may remain stagnant in the accumulator for long periods. Similarly, since cooling fluid circulated in a closed fluid loop may gradually lose some portion of the cooling fluid over a long duration of time, the stored cooling fluid in a fluid reservoir may remain stagnant in the fluid reservoir for long periods. Generally, chemicals in a stored cooling fluid may degrade and/or may come out of (or release from) the stored cooling fluid. Hence, the stored cooling fluid may degrade such that it no longer maintains certain properties, such as corrosion and biological growth inhibition properties. Such properties are essential to minimize degradation of the closed fluid loop. As a result, when some portion of the stored cooling fluid is pushed and/or injected into the closed fluid loop, it may inadvertently introduce bacteria and/or corrosive particles into the closed fluid loop, thereby contaminating the whole mixture of the cooling fluid in the closed fluid loop. Thus, when such cooling systems are used to cool electronic devices, the electronic devices may be forced to undergo unavoidable shut down to replace contaminated cooling fluid. Further, when cooling systems require a component (e.g., accumulator) to regulate pressure and a separate component (e.g., fluid reservoir) to regulate loss of cooling fluid, such cooling systems may be cumbersome, occupy more space, and may be expensive to maintain. Further, the electronic devices may be forced to separately undergo shut down for maintenance and replacement of the accumulator and of the fluid reservoir.

A technical solution to the aforementioned problems may include providing a pressure regulator assembly for a closed fluid loop of a CDU. The pressure regulator assembly may include a cylinder having an internal volume and first and second hollow pistons slidably connected to the internal volume to split the internal volume into a first volume portion having a cooling fluid, a second volume portion having a driver fluid, and a third volume portion having a compressible matter. The first volume portion is fluidically connected to the closed fluid loop to allow a continuous flow of the cooling fluid in the closed fluid loop via the pressure regulator assembly, thereby preventing stagnation of the cooling fluid.

The first piston may be reciprocated by the compressible matter stored in the third volume portion to manage pressure (operating pressure) variations caused due to pressure spikes and/or thermal expansion and contraction of the cooling fluid in the closed fluid loop. Thus, the third volume portion having the compressible matter and the first volume portion having the cooling fluid, along with the first hollow piston, may function as an accumulator of the closed fluid loop to maintain an operating pressure of the cooling fluid in the closed fluid loop.

Further, the second piston may be slidably driven by the driver fluid in response to a predefined pressure drop of the cooling fluid in the closed fluid loop during a predefined time period, to inject an additional cooling fluid from the first volume portion into the closed fluid loop to restore a pressure level to the operating pressure. The predefined pressure drop during the predefined time period may be caused due to loss of cooling fluid from the closed fluid loop or plumbing of the CDU over a period of time. Thus, the second volume portion having the driver fluid and the first volume portion having the cooling fluid, along with the second hollow piston may function as the cooling fluid reservoir to restore the operating pressure of the cooling fluid in the closed fluid loop. Further, the second volume portion having the driver fluid may directly or indirectly drive the compressible matter via the first hollow piston to compress the compressible matter to simultaneously restore the cooling fluid in the first volume portion to the operating pressure.

In one or more examples of the present disclosure, the pressure regulator assembly may function as a combined assembly of an accumulator and a cooling fluid reservoir. Thus, the pressure regulator assembly may simultaneously maintain the operating pressure of the cooling fluid in the closed fluid loop and restore the pressure level of the cooling fluid in the closed fluid loop to the operating pressure. Moreover, the pressure regulator assembly may be easier to handle, less expensive, and require less space for installation as compared to cooling systems requiring a separate accumulator and cooling fluid reservoir. Further, the electronic device having the pressure regulator assembly may not be forced to separately undergo shut down for maintenance and/or replacement of an accumulator and a cooling fluid reservoir.

Accordingly, in one or more examples of the present disclosure, a pressure regulator assembly for a closed fluid loop of a coolant distribution unit (CDU) is disclosed. The pressure regulator assembly includes a cylinder, a first hollow piston, and a second hollow piston. The cylinder has an internal volume defined between an inlet and an outlet. The first and second hollow pistons are slidably connected to the cylinder to split the internal volume into a first volume portion having a cooling fluid, a second volume portion having a driver fluid, and a third volume portion having a compressible matter. The first volume portion is fluidically connected to a closed fluid loop of the CDU. The first hollow piston is reciprocated by the compressible matter to maintain an operating pressure of the cooling fluid in the closed fluid loop. The second hollow piston is driven by the driver fluid in response to detection by the sensor of a predefined pressure drop of the cooling fluid in the closed fluid loop during a predefined time period, to inject an additional cooling fluid from the first volume portion into the closed fluid loop to regulate a loss of the cooling fluid in the CDU, and thereby restore a pressure level of the cooling fluid in the closed fluid loop to the operating pressure.

Turning to the Figures, FIG. 1 depicts a block diagram of a pressure regulator assembly 100 for a coolant distribution unit (CDU). It should be understood that FIG. 1 is not intended to illustrate specific shapes, dimensions, or other structural details accurately or to scale, and that implementations of the pressure regulator assembly 100 may have different numbers and arrangements of the illustrated components and may also include other parts that are not illustrated.

As shown in FIG. 1, the pressure regulator assembly 100 includes a cylinder 102, a first hollow piston 104, and a second hollow piston 106. The cylinder 102 has an inlet 108, an outlet 110, and an internal volume 112 defined between the inlet 108 and the outlet 110. The first hollow piston 104 and the second hollow piston 106 are slidably connected to the cylinder 102 to split the internal volume 112 into a first volume portion 114 having the cooling fluid 116, a second volume portion 118 having a driver fluid 120, and a third volume portion 122 having a compressible matter 124. The first hollow piston 104 includes a hollow-rod section 104A and a hollow-head section 104B extended from the hollow-rod section 104A. Similarly, the second hollow piston 106 includes a hollow-rod section 106A and a hollow-head section 106B extended from the hollow-rod section 106A. In some non-limiting examples, one of the first hollow piston 104 or the second hollow piston 106 may only have the hollow-head section. In such examples, the hollow-head section of one of the first hollow piston 104 or the second hollow piston 106 may slide relative to the hollow-rod section of the other one of the first hollow piston 104 or the second hollow piston 106. In some examples, the hollow-rod section 104A may slide partially out of the pressure regulator assembly 100 through the outlet 110 and be fluidically connected to a first hose 126A (e.g., a first flexible tube or a first rigid tube) of the closed fluid loop 128. Similarly, the hollow-rod section 106A may slide partially out of the pressure regulator assembly 100 through the inlet 108 and be fluidically connected to a second hose 126B (e.g., a second flexible tube or a second rigid tube) of the closed fluid loop 128.

The pressure regulator assembly 100 may be used to: i) maintain an operating pressure of a cooling fluid 116 in a closed fluid loop 128 and ii) restore the pressure level of the cooling fluid 116 in the closed fluid loop 128 to the operating pressure. For example, the pressure regulator assembly 100 may function as a combined accumulator and cooling fluid reservoir to simultaneously maintain an operating pressure of a cooling fluid 116 in the closed fluid loop 128 and restore the pressure level of the cooling fluid 116 in the closed fluid loop 128 to the operating pressure.

In some examples, the first volume portion 114 is fluidically connected to the closed fluid loop 128 of the CDU via the first hollow piston 104 and the second hollow piston 106 to allow a continuous flow of the cooling fluid 116 in the closed fluid loop 128, thereby preventing stagnation of the cooling fluid 116 in the pressure regulator assembly 100. During operation of the CDU, the first hollow piston 104 may be reciprocated by the compressible matter 124 to push a portion of the cooling fluid 116 into the closed fluid loop 128 or pull the portion of the cooling fluid 116 into the first volume portion 114 to maintain the operating pressure of the cooling fluid 116 in the closed fluid loop 128. Thus, the pressure regulator assembly 100 may function as an accumulator without stagnating the cooling fluid 116 in the first volume portion 114 of the cylinder 102. Further, the second hollow piston 106 may be driven by the driver fluid 120 in response to a predefined pressure drop of the cooling fluid 116 in the closed fluid loop 128 during a predefined time period, to inject additional cooling fluid 116 from the first volume portion 114 into the closed fluid loop 128 to restore a pressure level to the operating pressure. Thus, the pressure regulator assembly 100 may additionally function as a cooling fluid reservoir without stagnating the cooling fluid 26 in the first volume portion 114 of the cylinder 102. Additionally, the driver fluid 120 may directly or indirectly drive the first hollow piston 104 to compress the compressible matter within the third volume portion 122 to simultaneously restore the compressible matter 124 to the operating pressure in the third volume portion 122.

Figure 2A:
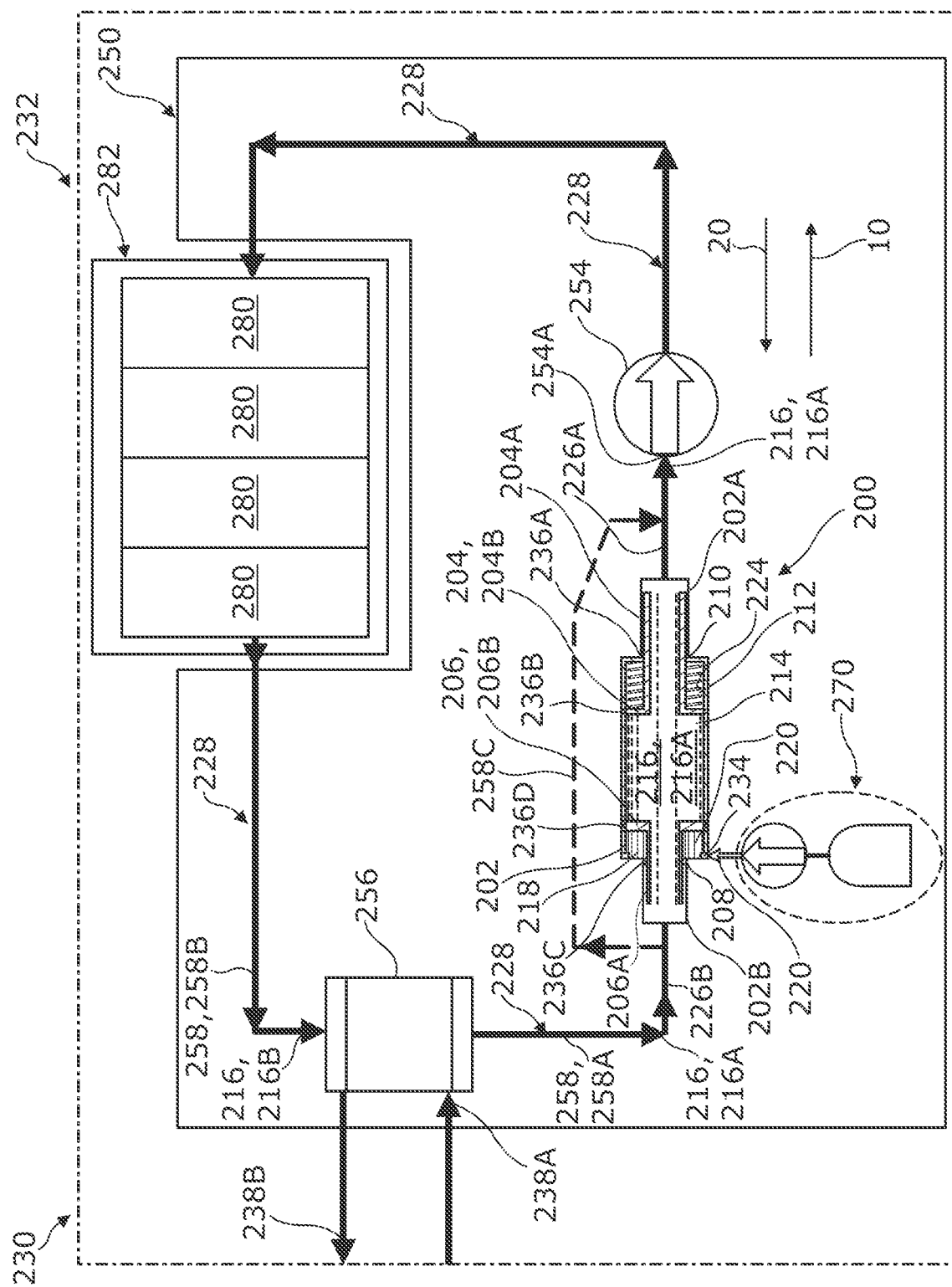
FIG. 2A illustrates a block diagram of a data center environment having a coolant distribution unit and a plurality of electronic devices according to an example implementation of the present disclosure.
Figure 2B:
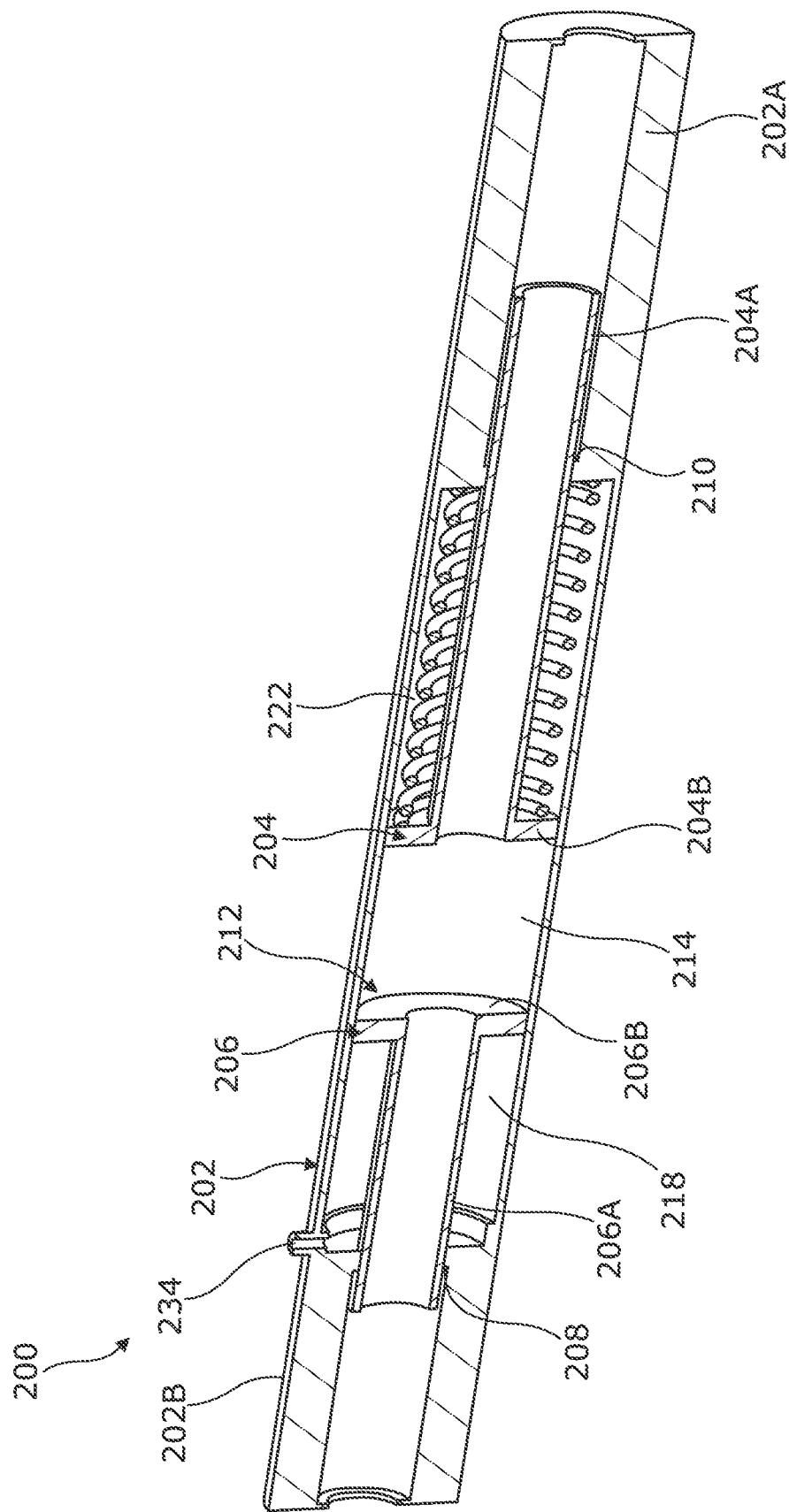
FIG. 2B illustrates a cross-sectional perspective view of a pressure regulator assembly of the CDU of FIG. 2A according to an example implementation of the present disclosure.

FIG. 2A depicts a block diagram of a data center environment 230 having a coolant distribution unit (CDU) 250 and a plurality of electronic devices 280. FIG. 2B depicts a cross-sectional perspective view of a pressure regulator assembly 200 of the CDU 250 of FIG. 2A. FIG. 2C depicts a perspective view of the pressure regulator assembly 200 of FIG. 2B connected to a driver fluid assembly 270. In the description hereinafter, FIGS. 2A-2C are described concurrently for ease of illustration. It should be understood that FIGS. 2A-2C are not intended to illustrate specific shapes, dimensions, or other structural details accurately or to scale, and that implementations of the data center environment 230 may have different numbers and arrangements of the illustrated components and may also include other parts that are not illustrated. During the operation of the data center environment 230, the plurality of electronic devices 280 may execute one or more workload(s) and the CDU 250 may perform thermal management of the plurality of electronic devices 280.

Referring to FIG. 2A, the plurality of electronic devices 280 are disposed within an interior space of a chassis 282. Further, the CDU 250 and the chassis 282 may be deployed within a rack 232 of the data center environment 230. In some examples, the CDU 250 deployed within the rack 232 may be referred to as a rack-level CDU. In some other examples, the data center environment 230 may include separate racks to deploy each of the chassis 282 and the CDU 250. In such examples, the CDU 250 deployed in one separate rack may be referred to as a centralized CDU. In such examples, the centralized CDU 250 may perform the thermal management of one or more chassis deployed in one or more separate racks.

The plurality of electronic devices 280 may include computers (e.g., servers, storage devices), networking devices (e.g., wireless access points, network switches, routers), or the like. Each of the plurality of electronic devices 280 may include primary electronic components (not shown), such as central processing units (CPUs), graphics processing units (GPUs), power supply chips, memory chips, and secondary electronic components, such as capacitors, inductors, resistors, or the like. Such electronic components may generate a considerable amount of waste heat, while executing one or more workloads. In such examples, the CDU 250 may be configured to dissipate the waste heat from each of the plurality of electronic devices 280 to enable proper functioning of the electronic components and prevent damage to the electronic components due to the waste heat.

The CDU 250 includes a pressure regulator assembly 200, a closed fluid loop 228, a circulation pump 254, a heat exchanger 256, and cold plates (not shown). It may be noted herein that the CDU 250 discussed in the example of FIG. 2A may be referred to as the rack-level CDU. In some other examples, the CDU 250 may be a centralized CDU, without deviating from the scope of the present disclosure.

The closed fluid loop 228 may include plumbing hoses (e.g., flexible tubes or rigid tubes), which may be connected to each other at multiple intersections to define a fluid flow path 258. The fluid flow path 258 may direct a flow of a cooling fluid 216 within the closed fluid loop 228 for thermal management of the plurality of electronic devices 280 deployed in the chassis 282. The fluid flow path 258 has a cooled fluid flow path 258A (or a main fluid flow path) and a heated fluid flow path 258B connected to each other. The cooled fluid flow path 258A extends from the heat exchanger 256 to the plurality of electronic devices 280 via the pressure regulator assembly 200 and the circulation pump 254. The heated fluid flow path 258B extends from the plurality of electronic devices 280 to the heat exchanger 256. In one or more examples, the cooled fluid flow path 258A directs a flow of a cooled fluid 216A from the heat exchanger 256 to the plurality of electronic devices 280, and the heated fluid flow path 258B directs the flow of a heated fluid 216B from the plurality of electronic devices 280 to the heat exchanger 256.

In the example of FIG. 2A, the pressure regulator assembly 200 is disposed in the cooled fluid flow path 258A defined by the closed fluid loop 228. In some other examples, the pressure regulator assembly 200 may be disposed in an auxiliary fluid flow path 258C defined by the closed fluid loop 228. In some examples, the auxiliary fluid flow path 258C may protrude from the main fluid flow path 258A, extend parallel to the main fluid flow path 258A, and merge back to the main fluid flow path 258A. In such examples, the main fluid flow path 258A may directly extend from the heat exchanger 256 to the circulation pump 254 bypassing the pressure regulator assembly 200, and the auxiliary fluid flow path 258C may extend from the heat exchanger 256 to the circulation pump 254 via the pressure regulator assembly 200. In some examples, the pressure regulator assembly 200 disposed in the auxiliary fluid flow path 258D may avoid issues related to pressure drops at a pump-inlet 254A of the circulation pump 254, which may be caused due to the pressure regulator assembly 200 located in the main fluid flow path 258A.

In one or more examples, the pressure regulator assembly 200 may function as a combined accumulator and cooling fluid reservoir to simultaneously maintain an operating pressure of the cooling fluid 216 in the closed fluid loop 228 and restore the pressure level of the cooling fluid 216 in the closed fluid loop 228 to the operating pressure. Referring to FIG. 2B, the pressure regulator assembly 200 includes a cylinder 202, a first hollow piston 204, and a second hollow piston 206. The cylinder 202 includes an inlet 208, an outlet 210, an internal volume 212 defined between the inlet 208 and the outlet 210, a first hollow connector section 202A protruding outwards from the outlet 210, and a second hollow connector section 202B protruding outwards from the inlet 208. In some examples, the first hollow connector section 202A may be connected to a first hose 226A (e.g., a first flexible tube or a first rigid tube) of the CDU 250 and the second hollow connector section 202B may be connected to a second hose 226B (e.g., a second flexible tube or a second rigid tube) of the CDU 250. The first hollow piston 204 includes a first hollow-rod section 204A and a first hollow-head section 204B extending from the first hollow-rod section 204A. Similarly, the second hollow piston 206 includes a second hollow-rod section 206A and a second hollow-head section 206B extending from the second hollow-rod section 206A. The first hollow piston 204 is slidably connected to the cylinder 202 via the outlet 210 and the second hollow piston 206 is slidably connected to the cylinder 202 via the inlet 208 such that the first hollow-head section 204B and second hollow-head section 206B faces each other and disposed spaced apart each other within the cylinder 202. Accordingly, when the first hollow piston 204 and the second hollow piston 206 are disposed in the cylinder 202, they may split the internal volume 212 of the cylinder 202 into a first volume portion 214, a second volume portion 218, and a third volume portion 222. The first volume portion 214 is defined between the first hollow-head section 204B and the second hollow-head section 206B. The second volume portion 218 is defined between the second hollow-head section 206B and the inlet 208 of the cylinder 202. Similarly, the third volume portion 222 is defined between the first hollow-head section 204B and the outlet 210 of the cylinder 202. In some examples, the first hollow-head section 204B may reciprocate within the cylinder 202, and the first hollow-rod section 204A may reciprocate within the cylinder 202 and the first hollow connector section 202A via the outlet 210. Similarly, the second hollow-head section 206B may reciprocate within the cylinder 202, and the second hollow-rod section 206A may reciprocate within the cylinder 202 and the second hollow connector section 202B via the inlet 208. As discussed herein, the first hollow connector section 202A may be connected to the first hose 226A and the second hollow connector section 202B may be connected to the second hose 226B of the CDU 250.

As shown in FIG. 2A, the first volume portion 214 is filled with a cooling fluid 216, the second volume portion 218 is filled with a driver fluid 220, and the third volume portion 222 is filled with a compressible matter 224. In one or more examples, the first volume portion 214 is further fluidically connected to the closed fluid loop 228 e.g., the cooled fluid flow path 258A via the first hollow connector section 202A, the first hollow piston 204, the second hollow piston 206, and the second hollow connector section 202B. Accordingly, the cooling fluid 216 filled in the first volume portion 214 may flow continuously in the closed fluid loop 228, thereby preventing stagnation of the cooling fluid 216 within the first volume portion 214 of the pressure regulator assembly 200.

The cylinder 202 further includes a first opening 234 formed on a section of the cylinder 202 that corresponds to the second volume portion 218. In such examples, a driver fluid assembly 270 (as shown in FIGS. 2A and 2C) of the pressure regulator assembly 200 is connected to the second volume portion 218 via the first opening 234. The first opening 234 may be either in an open position to provision inflow of the driver fluid into the second volume portion 218 or in a closed position to provision outflow of the driver fluid from the second volume portion 218, as discussed in details below. In some examples, the driver fluid 220 pumped into the second volume portion 218 may additionally drive the first hollow piston 204 along the first direction 10 via the second hollow piston 206 and the cooling fluid 216 in the first volume portion 214, as discussed in greater detail below. In one or more examples, each of the cooling fluid 216 and the driver fluid 220 is a non-compressible fluid. Since the driver fluid 220 in the second volume portion 218 is a non-compressible fluid, the driver fluid 220 may prevent the second hollow piston 206 from sliding in a second direction 20 opposite to the first direction 10, when the compressible matter 224 pushes the cooling fluid 216 in the first volume portion 214 along the second direction 20 via the first hollow piston 204.

As shown in FIG. 2A, the pressure regulator assembly 200 further includes a pair of first sealing elements 236A, a pair of second sealing elements 236B, a pair of third sealing elements 236C, and a pair of fourth sealing elements 236D. The pair of first sealing elements 236A may be coupled to the outlet 210 of the cylinder 202. In such examples, the pair of first sealing elements 236A may seal the interface between the outlet 210 and an outer surface of the first hollow-rod section 204A of the first hollow piston 204 to prevent leakage of the compressible matter 224 from the third volume portion 222 to outside the pressure regulator assembly 200 or leakage of the cooling fluid 216 from the first hollow connector section 202A into the third volume portion 222. The pair of second sealing elements 236B may be coupled to the first hollow-head section 204B of the first hollow piston. The pair of second sealing elements 236B may seal the interface between an inner surface of the cylinder 202 and the first hollow-head section 204B to prevent the leakage of the compressible matter 224 from the third volume portion 222 into the first volume portion 214 of the cylinder 202 or leakage of the cooling fluid 216 from the first volume portion 214 into the third volume portion 222.

The pair of third sealing elements 236C may be coupled to the inlet 208 of the cylinder 202. The pair of third sealing elements 236C may seal the interface between the inlet 208 and an outer surface of the second hollow-rod section 206A of the second hollow piston 206 to prevent leakage of the driver fluid 220 from the second volume portion 218 to outside the pressure regulator assembly 200 or leakage of the cooling fluid 216 from the second hollow connector section 202B into the second volume portion 218. The pair of fourth sealing elements 236D may be coupled to the second hollow-head section 206B of the second hollow piston 206. The pair of fourth sealing elements 236D may seal the interface between an inner surface of the cylinder 202 and the second hollow-head section 206B to prevent the leakage of the driver fluid 220 from the second volume portion 218 into the first volume portion 214 of the cylinder 202 or leakage of the cooling fluid 216 from the first volume portion 214 into the second volume portion 218.

Referring to FIGS. 2A and 2C, as discussed herein, the driver fluid assembly 270 of the pressure regulator assembly 200 is connected to the second volume portion 218 of the cylinder 202 via the first opening 234. The driver fluid assembly 270 includes a main conduit 240A, a bypass conduit 240B, a driver pump 242 connected to the main conduit 240A, a valve 244, and a driver fluid reservoir 246. The main conduit 240A is connected to the first opening 234 and the driver fluid reservoir 246 via the driver pump 242. The valve 244 is connected to the main conduit 240A and disposed between the driver pump 242 and the first opening 234. The bypass conduit 240B is connected to the valve 244 and the driver fluid reservoir 246.

In some examples, the driver pump 242 is a fluid pump. The valve 244 is a three-way valve having multiple positions, such as a cut-off position, a first on position, and a second on position. In some examples, the valve 244 may be manually switched between multiple positions. In such examples, the driver pump 242 may be manually turned on or turned off. In some other examples, the valve 244 may be automatically switched between multiple positions. In such examples, the driver pump 242 may be automatically turned on or turned off by a controller (not shown in FIGS. 2A-2C). In the cut-off position of the valve 244 and the closed position of the first opening 234, the valve 244 may stop a flow of driver fluid 220 from the second volume portion 218 to the driver fluid reservoir 246 and vice versa. In the first on position of the valve 244 and the open position of the first opening 234, the valve 244 may establish an inlet flow path 248A from the driver fluid reservoir 246 to the second volume portion 218 via the driver pump 242, the main conduit 240A, and the first opening 234. In the second on position of the valve 244 and the open position of the first opening 234, the valve 244 may establish an outlet flow path 248B from the second volume portion 218 to the driver fluid reservoir 246 via the first opening 234, a portion of the main conduit 240A, and the bypass conduit 240B. The driver fluid reservoir 246 may have the driver fluid 220 stored in its internal volume.

In one or more examples, during setting up of the pressure regulator assembly 200 for use in the CDU 250, the pressure regulator assembly 200 may be first configured to a charged state. In some examples, the pressure regulator assembly 200 may be charged by filling: i) the driver fluid 220 in the second volume portion 218, ii) the compressible matter 224 in the third volume portion 222, and iii) the cooling fluid 216 in the first volume portion 214. In one or more examples, the compressible matter 224 filled in the third volume portion 222 may be at an atmospheric pressure. In some examples, the driver fluid 220 may occupy up to 10 percent of the internal volume 212 of the cylinder 202 and the compressible matter 224 may occupy up to 50 percent of the internal volume 212 of the cylinder 202 at the atmospheric pressure. In such examples, the cooling fluid 216 is filled in the first volume portion 214 via the second hollow connector section 202B, while the first hollow connector section 202A and the first opening 234 are in a closed position. Thus, the cooling fluid 216 filled in the first volume portion 214 may compress the compressible matter 224 in the third volume portion 222 via the first hollow piston 204 and the second hollow piston 206, until the compressible matter 224 is compressed to the operating pressure. In some examples, when the compressible matter 224 is compressed to the operating pressure, it may occupy up to 30 percent of the internal volume 212 of the cylinder 202. In one or more examples, when the cooling fluid 216 is filled in the first volume portion 214, the driver fluid 220 in the second volume portion 218 may prevent the second hollow piston 206 from sliding in the second direction 20, thereby allowing the cooling fluid 216 filled in first volume portion 214 to compress the compressible matter 224 in the third volume portion 222 via the first hollow piston 204 until the compressible matter 224 is compressed to the operating pressure. Accordingly, the pressure regulator assembly 200 may be construed to be in the charged state, when the compressible matter 224 is compressed to the operating pressure in the third volume portion 222. As used herein, "charged state" may refer to a physical condition of the cylinder 202, where about 60 percent of its internal volume 212 is filled with the cooling fluid 216, about 10 percent of its internal volume 212 is filled with the driver fluid 220, and about 30 percent of its internal volume 212 is filled with compressible matter 224. In other words, in the charged state of the pressure regulator assembly 200, the internal volume 212 of the cylinder 202 may be split in a ratio of about 60 percent of the first volume portion 214, about 10 percent of the second volume portion 218, and about 30 percent of the third volume portion 222.

In one or more examples, the pressure regulator assembly 200 in the charged state may be connected to the closed fluid loop 228. For example, the first hollow connector section 202A of the cylinder 202 is connected to the first hose 226A and the second hollow connector section 202B is connected to the second hose 226B such that the first volume portion 214 is fluidically connected to the cooled fluid flow path 258A of the closed fluid loop 228 in the CDU 250. In such examples, when the pressure regulator assembly 200 is connected to the closed fluid loop 228, the cooling fluid 216 in the closed fluid loop 228 and in the first volume portion 214 may be at the operating pressure.

Referring to FIGS. 2A-2B, the cooling fluid 216 may flow from the heat exchanger 256 to the circulation pump 254 via the pressure regulator assembly 200. In other words, the first volume portion 214 of the cylinder 202 is fluidically connected to the cooled fluid flow path 258A of the closed fluid flow path 258 via the first hollow piston 204 and the second hollow piston 206 to allow a continuous flow of the cooling fluid 216, e.g., the cooled fluid 216A from the heat exchanger 256 to the circulation pump 254 via the pressure regulator assembly 200. Accordingly, the pressure regulator assembly 200 of the present disclosure may prevent stagnation of the cooling fluid 216 within the pressure regulator assembly 200, and thereby overcome one or more problems associated with the stagnation of the cooling fluid 216 within a cooling fluid reservoir and/or an accumulator. In one or more examples, the cooling fluid 216 is one of a mixture of water and propylene glycol with additives, a dielectric fluid, water, and the driver fluid 220 is one of a propylene glycol, a hydraulic fluid, water, or a mixture of water and propylene glycol. The compressible matter 224 is one of a spring, (e.g., helical spring), elastomer component, or air. In the example of FIGS. 2A-2C, the compressible matter 224 is the helical spring. In one or more examples, each of the cooling fluid 216 and the driver fluid 220 is a non-compressible fluid. In some examples, the mixture of water and propylene glycol may be a ratio from about 95:5 percent to about 50:50 percent. Further, the additives may include corrosion inhibitors and biocides.

In one or more examples, the first hollow piston 204 may reciprocate i) upon expansion of the compressible matter 224 to push a portion of the cooling fluid 216 from the first volume portion 214 into the cooled fluid flow path 258A of the closed fluid loop 228 and ii) upon compression of the compressible matter 224 to pull the portion of the cooling fluid 216 from the cooled fluid flow path 258A of the closed fluid loop 228 into the first volume portion 214, to maintain the operating pressure of the cooling fluid 216 in the closed fluid loop 228, as discussed in greater details below. Further, the second hollow piston 206 may be slidably driven along the first direction 10 by the driver fluid 220 to reduce the first volume portion 214 (or increase the second volume portion 218) and inject a portion of the cooling fluid 216 from the first volume portion 214 into the cooled fluid flow path 258A of the closed fluid loop 228 to make up for the loss of the cooling fluid 216 in the CDU 250, as discussed in greater details below. Additionally, the first hollow piston 204 may be slidably driven along the first direction 10 by the driver fluid 220 to compress the compressible matter 224 to simultaneously restore the compressible matter 224 in the third volume portion 222 to the operating pressure, as discussed in greater details below.

Referring back to FIG. 2A, the circulation pump 254 is a fluid pump. The pump-inlet 254A receives the cooled fluid 216A directed from the heat exchanger 256 via the pressure regulator assembly 200. The circulation pump 254 pumps the cooled fluid 216 from the pump-inlet 254A to the plurality of electronic devices 280 via the cooled fluid flow path 258A. In such examples, the cooled fluid flow path 258A may be further connected to cooling conduits (not shown) disposed within the chassis 282 in either a series configuration or a parallel configuration. The cooling conduits may direct the flow of the cooled fluid 216A to the cold plate that are thermally coupled to respective electronic components of each electronic device 280 to transfer the waste heat from the respective electronic components to the cooled fluid 216A, and thereby generate the heated fluid 216B. The cooling conduits may later direct the heated fluid 216B from the plurality of electronic devices 280 to the heated fluid flow path 258B.

The heated fluid flow path 258B may direct the flow of the heated fluid 216B from the plurality of electronic devices 280 into the heat exchanger 256. In one or more examples, the heat exchanger 256 dissipates the waste heat in the heated fluid 216B and regenerates the cooled fluid 216A. In some examples, the heat exchanger 256 may be a liquid heat-exchanger, a rear door heat-exchanger, or the like. In one or more examples, the heat exchanger 256 may receive a facility cooled fluid 238A from the data center environment 230 to dissipate the waste heat from the heated fluid 216B and regenerate the cooled fluid 216A. For example, the heat exchanger 256 may indirectly transfer the waste heat from the heated fluid 216B to the facility cooled fluid 238A, and regenerate the cooled fluid 216A and a facility heated fluid 238B. The heat exchanger 256 may later direct the regenerated cooled fluid 216A to the pump-inlet 254A of the circulation pump 254 via the pressure regulator assembly 200.

Even though the CDU 250 depicted in the example of FIG. 1A has a single pressure regulator assembly 200 connected to the closed fluid loop 228, in some other examples, the CDU 250 may include a plurality of pressure regulator assemblies without deviating from the scope of the present disclosure. In some examples, the single pressure regulator assembly 200 may be too large to retrofit in an available space of the CDU 250 due to one of a stroke length of the first hollow piston 204 and/or the second hollow piston 206, a diameter of the cylinder 202, or combination thereof. Thus, the plurality of small-sized pressure regulator assemblies may be retrofitted in the available space of the CDU 250 instead of the single pressure regulator assembly 200 to overcome the aforementioned problems related to the available space of the CDU 250. In such examples, an overall internal volume of the plurality of small-sized pressure regulator assemblies may need to match to the internal volume of the single pressure regulator assembly 200. In some examples, the plurality of small-sized pressure regulator assemblies may be connected to the closed fluid loop 228 in one of a series configuration, a parallel configuration, or combinations thereof depending on the cooling requirement of the plurality of electronic devices 280.

Referring to FIGS. 2A and 2B, during operation of the data center environment 230, the pressure regulator assembly 200 may regulate variations in an operating pressure of the cooling fluid 216 in the closed fluid loop 228. For example, the pressure regulator assembly 200 may provide pressure relief in response to variations in the operating pressure caused due to pressure spikes and/or thermal expansion and contraction of the cooling fluid 216 in the closed fluid loop 228. The pressure spikes and/or thermal expansion and contraction may occur due to excessive or moderate rates of waste heat generated by the electronic devices 280 while executing one or more workloads. The pressure regulator assembly 200 may ensure that positive pressure is maintained within closed fluid loop 228, e.g., at the pump-inlet 254A for directing the flow of the cooling fluid 216 in the closed fluid loop 228 without any issues related to cavitation in the circulation pump 254 and in the plumbing of the CDU 250.

For example, the plurality of electronic devices 280 may generate a nominal amount of waste heat while executing the one or more workloads. Accordingly, the cooling fluid 216 directed in the closed fluid loop 228 may be maintained at the operating pressure by the compressible matter 224 in the third volume portion 222 while handling such nominal amount of the waste heat. Accordingly, such state of the pressure regulator assembly 200 may be referred to as a normal operating state. However, at times, the plurality of electronic devices 280 may generate either an excessive amount or a moderate amount of waste heat due to varied power consumption rates while executing the one or more workloads. Accordingly, the operating pressure of the cooling fluid 216 in the closed fluid loop 228 may fluctuate while handling such excessive or moderate amount of waste heat, thus resulting in either expanding or compressing the compressible matter 224 in the third volume portion 222 to maintain the operating pressure of the cooling fluid 216 in the closed fluid loop 228.

For example, an excessive amount of waste heat may cause pressure spikes and/or thermal expansion of the cooling fluid 216, resulting in an increase of the operating pressure of the cooling fluid 216 in the closed fluid loop 228. In some examples, an excessive amount of waste heat may be generated due to over utilization of the primary electronic components to execute the workloads, e.g., graphics intensive workloads. In such examples, the compressible matter 224 may be compressed by the sliding movement of the first hollow-head section 204B of the first hollow piston 204 along the first direction 10 to pull a portion of the cooling fluid 216 from the closed fluid loop 228 into the first volume portion 214, thus maintaining the operating pressure of the cooling fluid 216 in the closed fluid loop 228. Accordingly, the pressure regulator assembly 200 may move from the normal operating state (or an expanded operating state) to a compressed operating state to maintain the operating pressure of the cooling fluid 216 in the closed fluid loop 228. In such examples, the portion of the cooling fluid 216 pulled into the first volume portion 214 may additionally apply pressure on the second hollow piston 206 to move the second hollow piston 206 along the second direction 20. However, the non-compressible driver fluid 220 filled in the second volume portion 218 may apply counter pressure on the second hollow piston 206, and thereby prevent the second hollow piston 206 from moving along the second direction 20. In some examples, when the pressure regulator assembly 200 is in the compressed operating state, the compressible matter 224 may be compressed up to 10 percent of the internal volume 212 of the cylinder 202 to maintain the operating pressure of the cooling fluid 216 in the closed fluid loop 228. Thus, the pressure regulator assembly 200 may prevent the problems associated with cavitation in the circulation pump 254 and in plumbing of the CDU 250.

Further, a moderate amount of waste heat may cause a thermal contraction of the cooling fluid 216, resulting in a decrease of the operating pressure of the cooling fluid 216 in the closed fluid loop 228. In some examples, a moderate amount of waste heat may be generated due to normal utilization of the primary electronic components to execute the workloads. In such examples, the compressible matter 224 may be expanded resulting in sliding the first hollow-head section 204B of the first hollow piston 204 along the second direction 20 and pushing the portion of the cooling fluid 216 from the first volume portion 214 into the closed fluid loop 228, thus maintaining the operating pressure of the cooling fluid 216 in the closed fluid loop 238. Accordingly, the pressure regulator assembly 200 may move from the compressed operating state (or the normal operating state) to the expanded operating state to maintain the operating pressure of the cooling fluid 216 in the closed fluid loop 228. In such examples, the portion of the cooling fluid 216 pushed from the first volume portion 214 into the closed fluid loop 228 may additionally apply pressure on the second hollow piston 206 to move the second hollow piston 206 along the second direction 20. However, the non-compressible driver fluid 220 filled in the second volume portion 218 may apply counter pressure on the second hollow piston 206, thereby preventing the second hollow piston 206 from moving along the second direction 20. In some examples, when the pressure regulator assembly 200 is in the expanded operating state, the compressible matter 224 may be expanded up to 50 percent of the internal volume 212 of the cylinder 202 to maintain the operating pressure of the cooling fluid 216 in the closed fluid loop 228. Thus, the pressure regulator assembly 200 may prevent the problems associated with cavitation in the circulation pump 254 and in plumbing of the CDU 250.

In some examples, when the plurality of electronic devices 280 returns to generate the nominal amount of waste heat, the cooling fluid 216 may return from the thermally contracted condition or the thermally expanded condition to a thermally normal condition in the closed fluid loop 228. In such examples, when the cooling fluid 216 returns from the thermally expanded condition to the thermally normal condition in the closed fluid loop 228, the compressible matter 224 may be expanded to return the pressure regulator assembly 200 back to the normal operating state from the compressed operating state. Accordingly, the compressible matter 224 may push the portion of the cooling fluid 216 back into the closed fluid loop 228 from the first volume portion 214, thereby maintaining the operating pressure of the cooling fluid 216 in the closed fluid loop 228. Similarly, when the cooling fluid 216 returns from the thermally contracted condition to the thermally normal condition in the closed fluid loop 228, the compressible matter 224 may be compressed to return the pressure regulator assembly 200 back to the normal operating state from the expanded operating state. Accordingly, the compressible matter 224 may pull the portion of the cooling fluid 216 back into the first volume portion 214 from the closed fluid loop 228, thereby maintaining the operating pressure of the cooling fluid 216 in the closed fluid loop 228.

In one or more examples, the CDU 250 may tend to lose some portion of cooling fluid 216 over time due to evaporation within the closed fluid loop 228 and/or dripping from one or more plumbing joints of the CDU 250. Accordingly, such loss of the cooling fluid 216 may gradually decrease an operating pressure of the cooling fluid 216 in the closed fluid loop 228. When the operating pressure drops below a predefined pressure at the pump-inlet 254A of the circulation pump 254 for a predefined time period, it can cause cavitation of the circulation pump 254, resulting in pump damage. Further, cavitation may occur at certain pressure points in the plumbing joints of the CDU 250, resulting in damage to the plumbing of the CDU 250, and thus leading to a premature failure of CDU 250. Additionally, when the operating pressure drops in the closed fluid loop 228, the compressible matter 224 may also expand to push some portion of the cooling fluid 216 in the first volume portion 214 into the closed fluid loop 228 to manage the operating pressure in the closed fluid loop 228. Thus, the compressible matter 224 may stay in the expanded operating state and be unable to handle the operating pressure variations due to thermal contraction of the cooling fluid 216, until the compressible matter 224 is restored to the normal operating state. In one or more examples, the second hollow piston 206 may be actuated (e.g., pushed or slid) by the driver fluid 220 in response to the predefined pressure drop of the cooling fluid 216 in the closed fluid loop 228 during the predefined time period. For example, the driver fluid 220 may drive the second hollow piston 206 to slide along the first direction 10, when the operating pressure drops below the predefined pressure. Thus, the second hollow piston 206 may reduce the first volume portion 214 of the cylinder 202 and inject the additional cooling fluid (e.g., a portion of the cooling fluid 216) from the first volume portion 214 into the closed fluid loop 228, thereby restoring a pressure level of the cooling fluid 216 in the closed fluid loop 228 to the operating pressure, as discussed in greater details below in the example of FIG. 3. Thus, the pressure regulator assembly 200 may additionally prevent the problems associated with cavitation of the circulation pump 254 and plumbing in the CDU 250. In one or more examples, the driver fluid 220 may also drive the first hollow piston 204 to compress the compressible matter 224 to simultaneously restore the compressible matter 224 in the third volume portion 222 to the operating pressure, as discussed in greater details below in the example of FIG. 3. Accordingly, the compressible matter 224 may be restored from the expanded operating state to the normal operating state and thereby enable the pressure regulator assembly 200 to handle the operating pressure variations due to pressure spikes and/or thermal expansion and contraction of the cooling fluid 216. In some examples, the operating pressure may be in a range from about 10 pounds per square inch (psi) to about 150 psi, the predefined pressure drop may be about 10 percent of the operating pressure, and the predefined time period may be about 1 minute. Thus, the pressure regulator assembly 200 may function as a combined accumulator and cooling fluid reservoir. In other words, the pressure regulator assembly 200 may simultaneously maintain the operating pressure of the cooling fluid 216 in the closed fluid loop 228 and restore the pressure level of the cooling fluid 216 in the closed fluid loop to the operating pressure.

Figure 3:
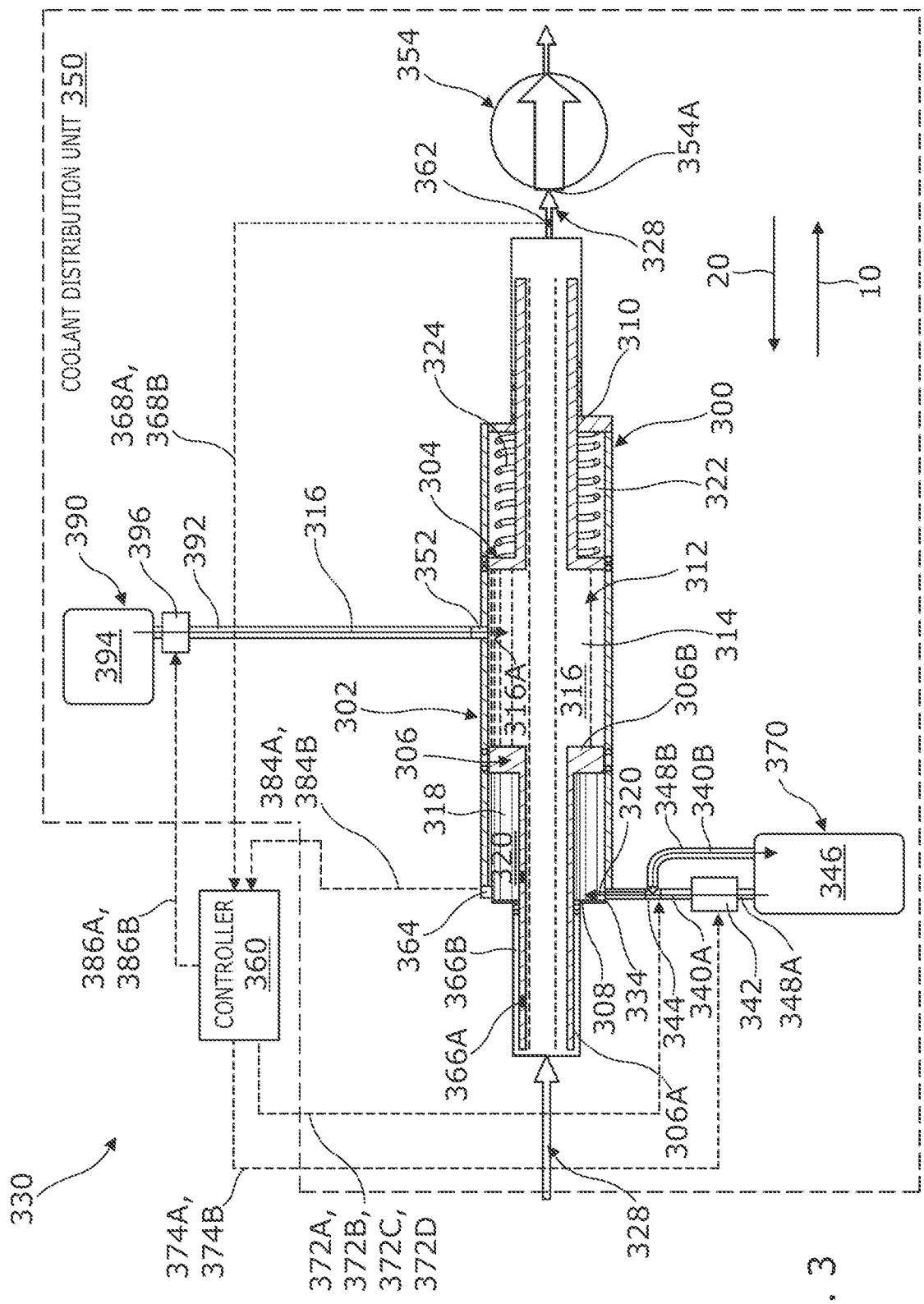
FIG. 3 illustrates a block diagram of a portion of a data center environment having a portion of a coolant distribution unit and a controller according to another example implementation of the present disclosure.

FIG. 3 depicts a block diagram of a portion of a data center environment 330 having a portion of a CDU 350 and a controller 360. The data center environment 330 may additionally include a plurality of electronic devices (not shown) as discussed herein in the example of FIG. 2A. It should be understood that FIG. 3 is not intended to illustrate specific shapes, dimensions, or other structural details accurately or to scale, and that implementations of the data center environment 330 may have different numbers and arrangements of the illustrated components and may also include other parts that are not illustrated.

It may be noted that the plurality of electronic devices may be substantially similar to a plurality of electronic devices 280 of FIG. 2A, without deviating from the scope of the present disclosure. Further, the CDU 350 is substantially similar to a CDU 250 of FIG. 1A. For example, the CDU 350 includes a closed fluid loop 328, a pressure regulator assembly 300, a circulation pump 354, a heat exchanger (not shown), cooling components (not shown), a driver fluid assembly 370, a supplementary cooling fluid assembly 390, a sensor, e.g., a pressure sensor 362, and a limit switch 364. It may be noted that the supplementary cooling fluid assembly 390 is an additional component/device in the CDU 350 when compared with other components/devices of the CDU 250, as shown in the example of FIG. 2A.

Accordingly, the following descriptions of the CDU 350 do not further describe the closed fluid loop 328, the circulation pump 354, the heat exchanger, the cooling components, and the driver fluid assembly 370 for the sake of brevity, and such non-descriptions should not be considered as a limitation of the present disclosure.

The pressure regulator assembly 300 includes a cylinder 302, a first hollow piston 304, and a second hollow piston 306, as discussed in the example of FIGS. 2A-2C. The cylinder 302 includes an internal volume 312 defined between an inlet 308 and an outlet 310. The first hollow piston 304 and the second hollow piston 306 are slidably connected to the cylinder 302 via the outlet 310 and the inlet 308 respectively, to split the internal volume 312 into a first volume portion 314, a second volume portion 318, and a third volume portion 322. The first volume portion 314 is filled with a cooling fluid 316, and the second volume portion 318 is filled with a driver fluid 320, and the third volume portion 322 is filled with a compressible matter 324. The first volume portion 314 is fluidically connected to the closed fluid loop 328 via the first hollow piston 304, and the second hollow piston 306. The pressure regulator assembly 300 of FIG. 3 additionally includes a second opening 352 formed on another section of the cylinder 302 that corresponds to the first volume portion 314. In such examples, the supplementary cooling fluid assembly 390 is connected to the first volume portion 314 via the second opening 352, as discussed in detail below.

As noted in the example of FIG. 2C, the driver fluid assembly 370 of FIG. 2 also includes a main conduit 340A, a bypass conduit 340B, a driver pump 342 connected to the main conduit 340A, a valve 344, and a driver fluid reservoir 346. In such examples, the main conduit 340A is connected to the first opening 334 and the driver fluid reservoir 346 via the driver pump 342. Further, the valve 344 is connected to the main conduit 340A and disposed between the driver pump 342 and the first opening 334. The bypass conduit 340B is connected to the valve 344 and the driver fluid reservoir 346. As discussed hereinabove (referring to FIGS. 2A-2C), the driver fluid assembly 370 may be used to pump the driver fluid 320 into second volume portion 318 of the pressure regulator assembly 300. The pumped driver fluid 320 may drive the second hollow piston 306 so as to inject the additional portion of the cooling fluid 316 from the first volume portion 314, thereby making up for the loss of the cooling fluid 316 in the closed fluid loop 328 of the CDU 350, and returning the pressure level of the cooling fluid 316 in the closed fluid loop 328 to the operating pressure.

In one or more examples, the supplementary cooling fluid assembly 390 includes a supplementary conduit 392, a supplementary cooling fluid reservoir 394, and a supplementary pump 396 connected to the supplementary conduit 392. In some examples, the supplementary pump 396 is a fluid pump. The supplementary conduit 392 is connected to the second opening 352 and the supplementary cooling fluid reservoir 394 via the supplementary pump 396. In one or more examples, the supplementary cooling fluid assembly 390 is used to reinstate the pressure regulator assembly 300 from a discharged state to the charged state. As used herein, "discharged state" may refer to another physical condition of the cylinder 302, where about 20 percent of its internal volume 312 is filled with the cooling fluid 316, about 50 percent of its internal volume 312 is filled with the driver fluid 320, and about 30 percent of its internal volume 312 is filled with compressible matter 324. In other words, in the discharged state of the pressure regulator assembly 300, the internal volume 312 of the cylinder 302 may be split in a ratio of about 20 percent of the first volume portion 314, about 50 percent of the second volume portion 318, and about 30 percent of the third volume portion 322.

As discussed herein, the CDU 350 may tend to lose some portion of cooling fluid 316 over time due to evaporation within the closed fluid loop 328 and/or dripping from one or more plumbing joints of the CDU 350. Accordingly, such loss of the cooling fluid 316 may gradually decrease an operating pressure of the cooling fluid 316 in the closed fluid loop 328. When the operating pressure drops below a predefined pressure at the pump-inlet 354A of the circulation pump 354 during the predefined time period, it can cause cavitation of the circulation pump 354, resulting in damage to the pump. Further, cavitation may occur at certain pressure points in the plumbing joints of the CDU 350, resulting in damage to the plumbing of the CDU 350, and thereby leading to a premature failure of the CDU 350. Additionally, when the operating pressure drops in the closed fluid loop 328, the compressible matter 324 may also expand to push some portion of the cooling fluid 316 in the first volume portion 314 into the closed fluid loop 328 to manage the operating pressure in the closed fluid loop 328. Thus, the compressible matter 324 may cause the pressure regulator assembly 300 to stay in the expanded operating state and be unable to handle the operating pressure variations due to thermal contraction of the cooling fluid 316, until the compressible matter 324 is compressed to restore the pressure regulator assembly 300 to the normal operating state.

Accordingly, in one or more examples, the second hollow piston 306 is driven by the driver fluid 320 in response to a predefined pressure drop of the cooling fluid 316 in the closed fluid loop 328 during the predefined time period to restore i) the cooling fluid 316 in the closed fluid loop and ii) the compressible matter 324 in the third volume portion to the operating pressure. In some examples, the valve 344 is first moved to a first on position from a cut-off position to establish an inlet flow path 348A from the driver fluid reservoir 346 to the second volume portion 318 via the first opening 334 and the main conduit 340A. Later, in the first on position of the valve 344, the driver pump 342 is turned on to pump the driver fluid 320 from the driver fluid reservoir 346 into the second volume portion 318 via the inlet flow path 348A. In such examples, the driver fluid 320 pumped into the second volume portion 318 slidably drives the second hollow piston 306 along a first direction 10 and pushes a portion of the cooling fluid 316 from the first volume portion 314 into the closed fluid loop 328 until the pressure of the cooling fluid 316 is restored to the operating pressure. Accordingly, the first volume portion 314 is reduced to inject the portion of the cooling fluid 316 from the first volume portion 314 into the closed fluid loop 328 to return a pressure level to the operating pressure. Thus, the pressure regulator assembly 300 may additionally prevent the problems associated with cavitation of the circulation pump 354 and plumbing in the CDU 350. Additionally, the driver fluid 320 pumped into the second volume portion 318 indirectly drives the first hollow piston 304 along the first direction 10 via the second hollow piston 306 and the cooling fluid 316 in the first volume portion 314 so as to compress the compressible matter 324 in the third volume portion 322 and restore the compressible matter 324 to the operating pressure in the third volume portion 322. Accordingly, the compressible matter 324 when compressed within the third volume portion 322 may cause the pressure regulator assembly 300 to be restored from the expanded operating state to the normal operating state, and thereby enable the pressure regulator assembly 300 to handle the operating pressure variations due to pressure spikes and/or thermal expansion and contraction of the cooling fluid 316.

In one or more examples, over a period of time, the pressure regulator assembly 300 may move from the charged state to the discharged state by gradually adding in an additional portion of cooling fluid 316 from the first volume portion 314 to the closed fluid loop 328 to make up for the loss of the cooling fluid 316 in the closed fluid loop 328 of the CDU 350, and return the pressure levels of the closed fluid loop 328 to the operating pressure. Therefore, to reinstate the pressure regulator assembly 300 to the charged state, the valve 344 is first moved to a second on position from a cut-off position to establish an outlet flow path 348B from the second volume portion 318 to the driver fluid reservoir 346 via a first opening 334, a portion of the main conduit 340A, and the bypass conduit 340B. Then, in the second on position of the valve 344, the supplementary pump 396 is turned on to pump a supplementary cooling fluid 316A from the supplementary cooling fluid reservoir 394 into the first volume portion 314 in response to detection, by the limit switch 364, of the minimum threshold volume level of the cooling fluid in the first volume portion 314. In such examples, the supplementary cooling fluid 316A pumped into the first volume portion 314 slidably drives the second hollow piston 306 along the second direction 20 opposite to the first direction 10 and drains a portion of the driver fluid 320 from the second volume portion 318 into the driver fluid reservoir 346 via the outlet flow path 348B. In some examples, the portion of the driver fluid 320 drained into the driver fluid reservoir 346 may correspond to (or match) the portion of the supplementary cooling fluid 316A filled into the first volume portion 314. Thus, the portion of the supplementary cooling fluid 316A added (or pumped) into first volume portion 314 may assist the pressure regulator assembly 300 to reinstate the pressure regulator assembly 300 to the charged state.

In the example of FIG. 3, the controller 360 is shown to be disposed within the data center environment 330. In some other examples, the controller 360 may be disposed outside the data center environment 330. In one or more examples, the controller 360 may be located within a data center management server, which may be accessed by an administrator of the data center environment 330. Persons of skill in the art will understand that the controller 360 may include a processing resource and machine-readable medium (e.g., memory) to facilitate the execution of the functionality described herein. In some examples, the processing resource may be a physical processor, such as a central processing unit (CPU), a microprocessor, and/or other hardware devices suitable for performing the functionality described herein. In some examples, the machine-readable medium is non-transitory and is alternatively referred to as a non-transitory machine-readable medium. The controller 360 is communicatively coupled to the driver pump 342, the supplementary pump 396, and the valve 344.

The pressure sensor 362 is disposed on the closed fluid loop 328. For example, the pressure sensor 362 is located at a pump-inlet 354A and communicatively coupled to the controller 360. The pressure sensor 362 is configured to periodically detect the operating pressure of the cooling fluid 316 at the pump-inlet 354A, and generate a first set of input signals 368A and a second set of input signals 368B to the controller 360, which are indicative of the operating pressure of the cooling fluid 316 at the pump-inlet 354A during a predefined time period. The pressure sensor may later communicate each set of the first and second set of input signals 368A, 368B respectively to the controller 360.

The limit switch 364 is disposed on the cylinder 302 and communicatively coupled to the controller 360. For example, the limit switch 364 is located proximate to the inlet 308 of the cylinder 302. The limit switch 364 may further include a first electronic mechanical object 366A and a second electronic mechanical object 366B. The first electronic mechanical object 366A may be disposed proximate to the free end of the hollow-rod section 306A and the second electronic mechanical object 366B may be disposed proximate to the hollow-head section 306B of the second hollow piston 306. The limit switch 364 may detect a position of the second hollow piston 306 when the first electronic mechanical object 366A or the second electronic mechanical object 366B approaches the limit switch 364. In some examples, the limit switch 364 may detect a threshold position when the first electronic mechanical object 366A approaches the limit switch 364. For example, the limit switch 364 may detect the presence of the first electronic mechanical object 366A when the second hollow piston 306 slides within the cylinder 302 along the first direction 10 and reaches the threshold position. It may be noted herein, the threshold position may be indicative of a minimum threshold volume level of the cooling fluid 316 in the first volume portion 314. The limit switch 364 may detect a predefined position when the second electronic mechanical object approaches the limit switch 364. The limit switch 364 may detect the presence of the second electronic mechanical object 366B when the second hollow piston 306 slides within the cylinder 302 along the second direction 20 and reaches the predefined position. It may be noted herein, the predefined position may be indicative of a maximum threshold volume level of the cooling fluid 316 in the first volume portion 314. In some examples, the minimum threshold volume level is about 20 percent of the internal volume 312 of the cylinder 302 and the predefined volume level is about 60 percent of the internal volume 312 of the cylinder 302. Accordingly, the limit switch 364 may generate a third input signal 384A, which is indicative of the threshold position (or discharged state of the pressure regulator assembly 300) or a fourth input signal 384B, which is indicative of the predefined position (or charged state of the pressure regulator assembly 300), and communicate the third input signal 384A or the fourth input signal 384B to the controller 360.

In some examples, the driver fluid assembly 370 and the supplementary cooling fluid assembly 390 may be configured to operate automatically to perform their intended functions. For example, the controller 360 may receive the first set of input signals 368A from the pressure sensor 362, which is indicative of the operating pressures at the pump-inlet 354A during the predefined time period. The controller 360 may compare the received pressure data with a stored pressure data in its memory to determine whether the received pressure data is equal to or greater than the predefined pressure (e.g., the minimum threshold pressure) during the predefined time period. If the controller 360 determines that the received pressure data during the predefined time period is equal to the predefined pressure than the controller 360 may send a first control signal 372A to the valve 344 and a second control signal 374A to the driver pump 342. In some examples, upon receipt of the first control signal 372A, the valve 344A may move from the cut-off position to the first on position to establish an inlet flow path 348A from the driver fluid reservoir 346 to the second volume portion 318. After the valve 344 has moved to the first on position, the second control signal 374 may trigger the driver pump 342 to pump the driver fluid 320 from the driver fluid reservoir 346 into the second volume portion 318 via the inlet flow path 348A. The addition of the driver fluid 320 into the second volume portion 318 may slidably drive the second hollow piston 306 along the first direction 10 to reduce the first volume portion 314 (or increase the second volume portion 318) and inject an additional portion of the cooling fluid 316 from the first volume portion 314 into the closed fluid loop 328. Further, the addition of the driver fluid 320 into the second volume portion 318 may slidably drive the first hollow piston 304 along the first direction 10 to compress the compressible matter 324 and shift the pressure regulator assembly 300 from the expanded operating state to the normal operating state.

In one or more examples, the driver pump 342 may continuously pump the driver fluid 320 into the second volume portion 318 until the pressure level of the cooling fluid 316 in the closed fluid loop 328 and the compressible matter 324 are restored to the operating pressure. For example, the controller 360 may receive the second set of input signals 368B from the pressure sensor 362, which is indicative of the operating pressure at the pump-inlet 354A during the predefined time period. The controller 360 may compare the received pressure data with the stored pressure data to determine whether the received pressure data is equal to or greater than the predefined pressure (e.g., the minimum threshold pressure) during the predefined time period. If the controller 360 determines that the received pressure data during the predefined time period is greater than the predefined pressure, then the controller 360 may send a third control signal 374B to the driver pump 342 and a fourth control signal 372B to the valve 344. In some examples, upon receipt of the third control signal 374B, the driver pump 342 may stop pumping the driver fluid 320 from the driver fluid reservoir 346 into the second volume portion 318. After the driver pump 342 has stopped pumping the driver fluid 320 into the second volume portion 318, the fourth control signal 372B may instruct the valve 344 to move from the first on position to the cut-off position to stop the flow of the driver fluid 320 from the driver fluid reservoir 346 into the second volume portion 318. Thus, the driver fluid assembly 370 may automatically manage the loss of the cooling fluid 316 in the closed fluid loop 328 of the CDU 350, and return the pressure level of the cooling fluid 316 in the closed fluid loop 328 and the compressible matter 324 to the operating pressure.

The controller 360 may further receive the third input signal 384A from the limit switch 364 when the first electronic mechanical object 366A on the second hollow piston 306 approaches the limit switch 364. The third input signal 384A may be indicative of the threshold position (or the discharged state of the pressure regulator assembly 300). Accordingly, upon receipt of the third input signal 384A, the controller 360 may generate a fifth control signal 372C to the valve 344 and a sixth control signal 386A to the supplementary pump 396. In some examples, upon receipt of the fifth control signal 372C, the valve 344 may move from the cut-off position to the second on position to establish an outlet flow path 348B from the second volume portion 318 to the driver fluid reservoir 346. After the valve 344 has moved to the second on position, the sixth control signal 386A may trigger the supplementary pump 396 to pump a supplementary cooling fluid 316A from the supplementary cooling fluid reservoir 394 into the first volume portion 314. The addition of the supplementary cooling fluid 316A into the first volume portion 314 may slidably drive the second hollow piston 306 along the second direction 20 opposite to the first direction 10 to reduce the second volume portion 318 (or increase the first volume portion 314) and drain a portion of the driver fluid 320 from the second volume portion 318 into the driver fluid reservoir 346 via the outlet flow path 348B.

In one or more examples, the supplementary pump 396 may continuously pump the supplementary cooling fluid 316A into the first volume portion 314 until the volume level of the cooling fluid 316 and the supplementary cooling fluid 316A in the first volume portion 314 are increased to the predefined volume level from the minimum threshold volume level. For example, the controller 360 may receive the fourth input signal 384B from the limit switch 364 when the second electronic mechanical object 366B on the second hollow piston 306 approaches the limit switch 364. The fourth input signal 384B may be indicative of the predefined position (or the charged state of the pressure regulator assembly 300). Accordingly, upon receipt of the fourth input signal 384B, the controller 360 may generate a seventh control signal 386B to the supplementary pump 396 and an eight control signal 372D to the valve 344. In some examples, upon receipt of the seventh control signal 386B, the supplementary pump 396 may stop pumping the supplementary cooling fluid 316A from the supplementary cooling fluid reservoir 394 into the first volume portion 314. After the supplementary pump 396 has stopped pumping the supplementary cooling fluid 316A into the first volume portion 314, the eight control signal 372D may instruct the valve 344 to move from the second on position to the cut-off position to stop the flow of the driver fluid 320 from the second volume portion 318 into the driver fluid reservoir 346. Thus, the supplementary cooling fluid assembly 390 may automatically refill the supplementary cooling fluid 316A into the first volume portion 314 of the cylinder 302 to move the pressure regulator assembly 300 from the discharged state to the charged state.

Figure 4:
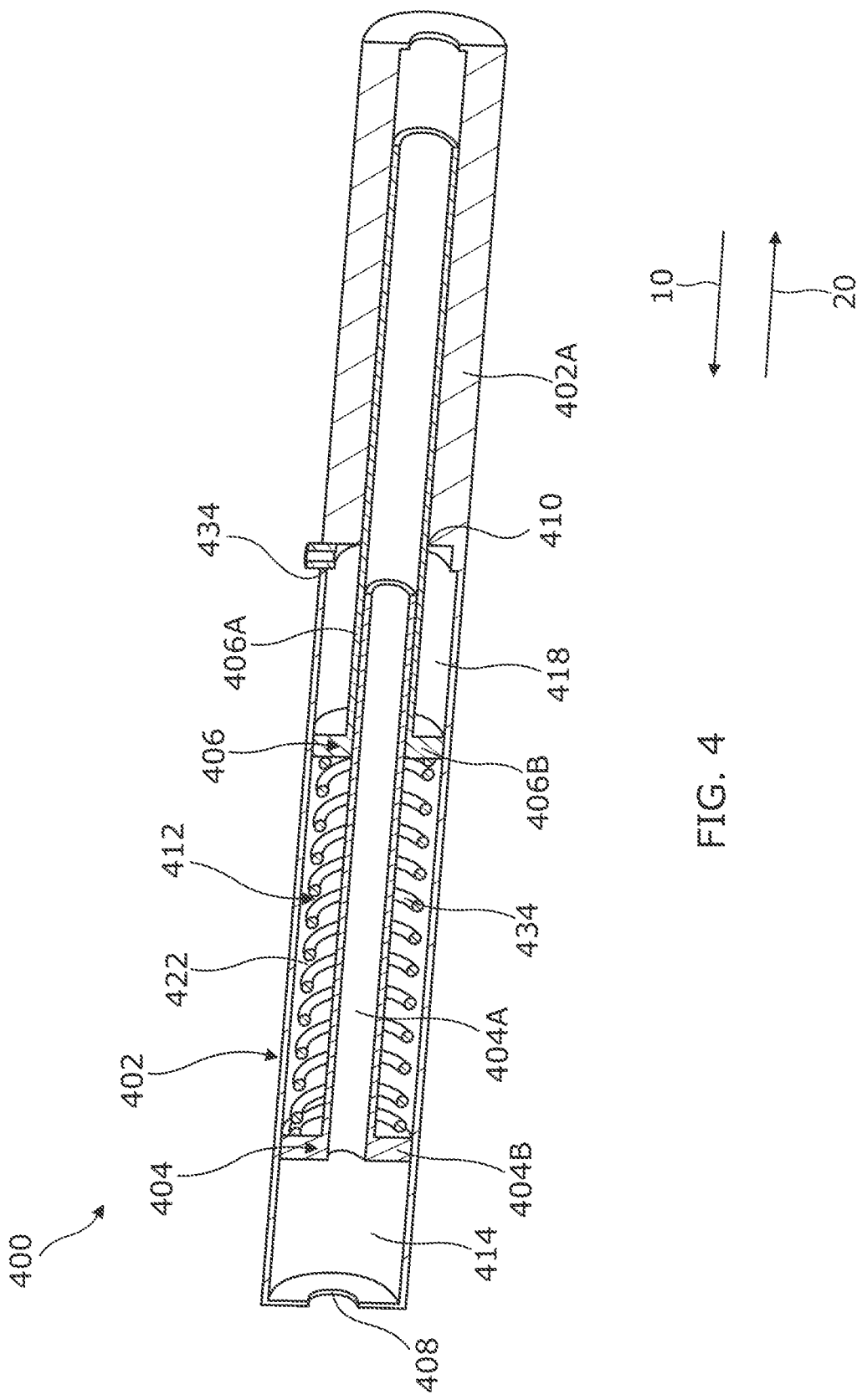
FIG. 4 illustrates a cross-sectional perspective view of a pressure regulator assembly according to another example implementation of the present disclosure.

FIG. 4 depicts a cross-sectional perspective view of a pressure regulator assembly 400. The pressure regulator assembly 400 includes a cylinder 402, a first hollow piston 404, and a second hollow piston 406. The cylinder 402 includes an internal volume 412 defined between an inlet 408 and an outlet 410. The first hollow piston 404 and the second hollow piston 406 are slidably connected to the cylinder 402 via the inlet 408 and the outlet 410 respectively, to split the internal volume 412 into a first volume portion 414, a second volume portion 418, and a third volume portion 422. In the example of FIG. 4, the cylinder 402 further includes a hollow connector section 402A protruded from the outlet 410. The inlet 408 may be directly connected to an inlet hose of a closed fluid loop (not shown). The outlet 410 may be connected to an outlet hose of the closed fluid loop via the hollow connector section 402A. The first hollow piston 404 includes a first hollow-rod section 404A and a first hollow-head section 404B extending from the first hollow-rod section 404A. The second hollow piston 406 includes a second hollow-rod section 406A and a second hollow-head section 406B extending from the second hollow-rod section 406A. The first hollow-rod section 404A of the first hollow piston 404 telescopes within the second hollow piston 406. In such examples, the first hollow piston 404 may reciprocate within the cylinder 402 and the second hollow piston 406. The second hollow piston 406 may reciprocate within the cylinder 402 and the hollow connector section 402A. The first volume portion 414 is defined between the first hollow-head section 404B and the inlet 408. The second volume portion 418 is defined between the second hollow-head section 406B and the outlet 410 of the cylinder 402. Similarly, the third volume portion 422 is defined between the first hollow-head section 404B and the second hollow-head section 406B of the cylinder 402.

In one or more examples, the first volume portion 414 may be filled with a cooling fluid, and the second volume portion 418 may be filled with a driver fluid, and the third volume portion 422 may be filled with a compressible matter 424, e.g. spring. In such examples, the first volume portion 414 may be fluidically connected to the closed fluid loop via the first hollow piston 404, the second hollow piston 406, and the hollow connector section 402A. Accordingly, the cooling fluid filled in the first volume portion 414 may flow continuously in the closed fluid loop, thereby preventing stagnation of the cooling fluid within the first volume portion 414 of the pressure regulator assembly 400. The cylinder 402 further includes a first opening 434 formed on a section of the cylinder 402 that corresponds to the second volume portion 418. In such examples, a driver fluid assembly of the pressure regulator assembly 400 may be connected to the second volume portion 418 via the first opening 434.

In one or more examples, the first hollow piston 404 may reciprocate i) upon expansion of the compressible matter 424 to push a portion of the cooling fluid from the first volume portion 414 into the closed fluid loop and ii) upon compression of the compressible matter 424 to pull the portion of the cooling fluid from the closed fluid loop into the first volume portion 414, to maintain the operating pressure of the cooling fluid in the closed fluid loop. In the example implementation, the compressible matter 424 may directly push the first hollow piston 404 along a first direction 10 so as to push the portion of the cooling fluid from the first volume portion 414 into the closed fluid loop. Similarly, the compressible matter 424 may be compressed by the slidable movement of the first hollow piston 404 along the second direction 20 caused by the portion of the cooling fluid pushed into the first volume portion 414 from the closed fluid loop. Accordingly, the pressure regulator assembly 400 may handle the pressure spikes and/or thermal expansion and contraction of the cooling fluid in the closed fluid loop.

Further, the second hollow piston 406 may be slidably driven along the first direction 10 by the driver fluid in response to a predefined pressure drop of the cooling fluid in the closed fluid loop during a predefined time period. In some examples, the driver fluid is pumped into the second volume portion 418 via the first opening 434 to drive the second hollow piston 406 along the first direction 10 and reduce the first volume portion 414. For example, the second hollow piston 406 may slidably push the first hollow piston 404 via the compressible matter 424 filled in the third volume portion 422 to reduce the first volume portion 414. Accordingly, the reduction of the first volume portion 414 may result in injecting a portion of the cooling fluid from the first volume portion 414 into the closed fluid loop to make up for the loss of the cooling fluid in a CDU, and thereby restoring the operating pressure of the cooling fluid in the closed fluid loop. Additionally, the second hollow piston 406 may slidably push the compressible matter 424 to compress the compressible matter 424 and restore the compressible matter 424 in the third volume portion 422 to the operating pressure.

Figure 5:
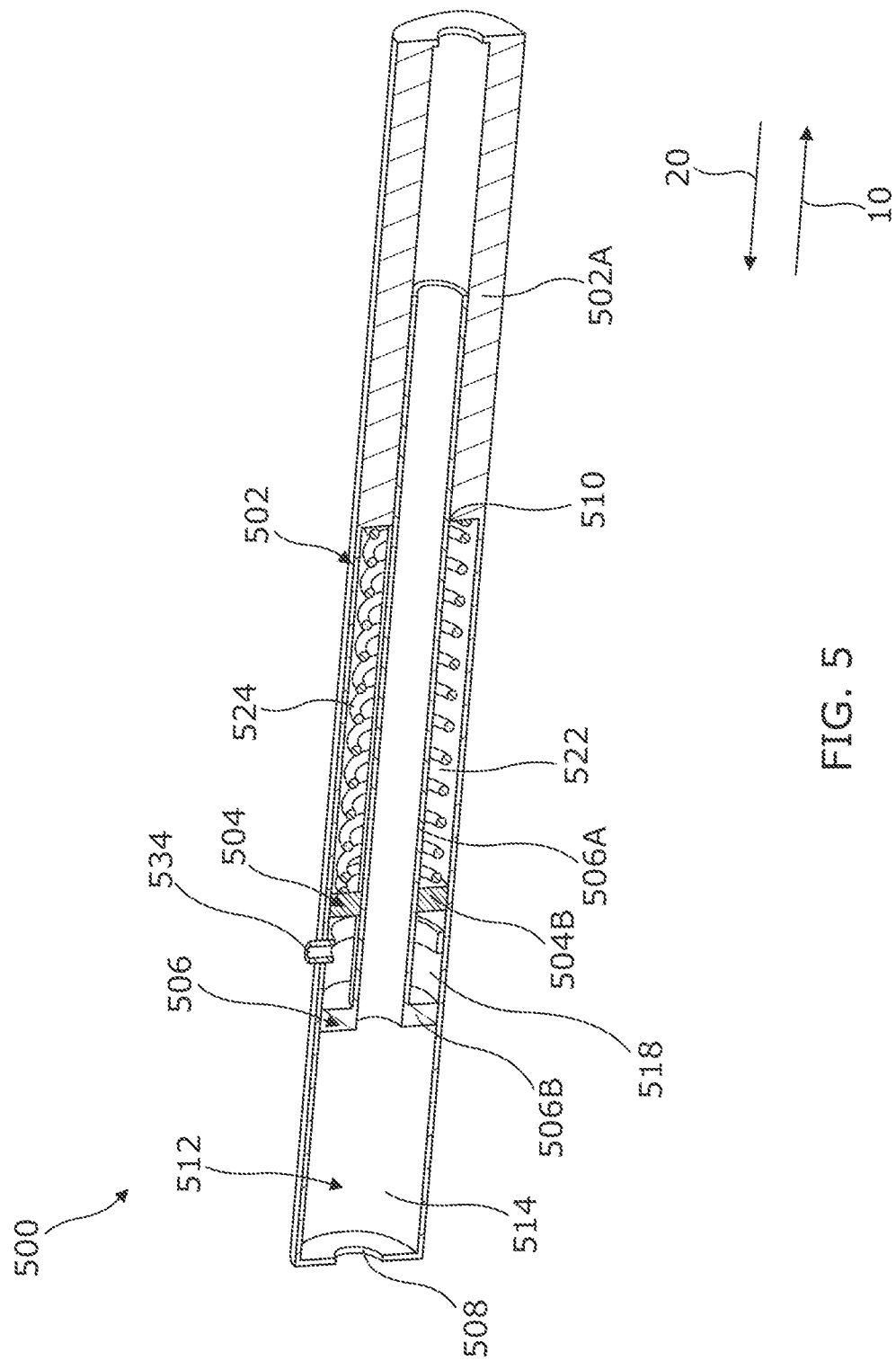
FIG. 5 illustrates a cross-sectional perspective view of a pressure regulator assembly according to yet another example implementation of the present disclosure.
Figure 6:
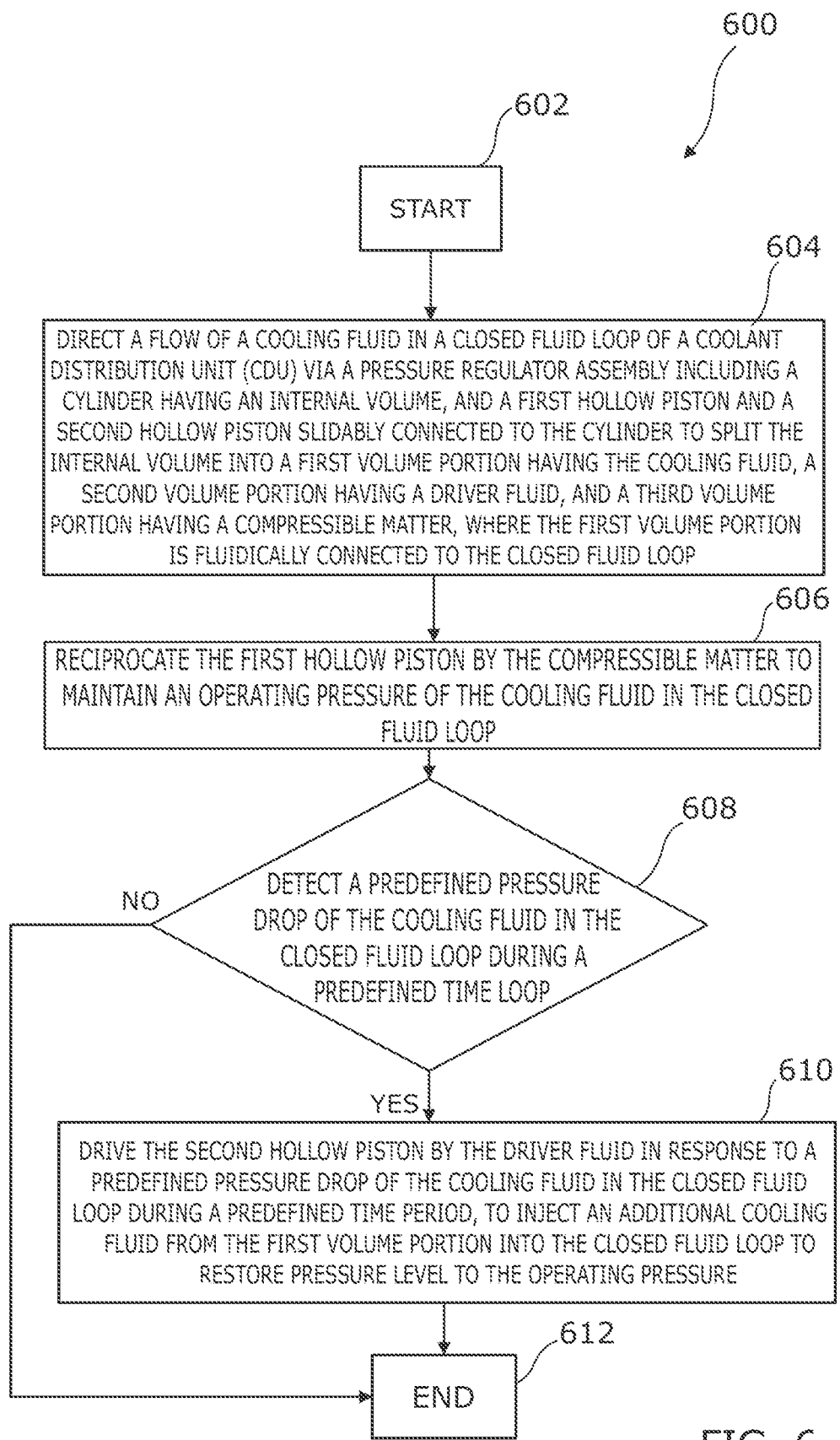
FIG. 6 illustrates a flowchart depicting a method of operating a pressure regulator assembly for regulating an operating pressure of a cooling fluid in a coolant distribution unit according to an example implementation of the present disclosure.

FIG. 5 depicts a cross-sectional perspective view of a pressure regulator assembly 500. The pressure regulator assembly 500 includes a cylinder 502, a first hollow piston 504, and a second hollow piston 506. The cylinder 502 includes an internal volume 512 defined between an inlet 508 and an outlet 510. The first hollow piston 504 and the second hollow piston 506 are slidably connected to the cylinder 502 via the outlet 510 and the inlet 508 respectively, to split the internal volume 512 into a first volume portion 514, a second volume portion 518, and a third volume portion 522. In the example of FIG. 5, the cylinder 502 further includes a hollow connector section 502A protruded from the outlet 510. The inlet 508 may be directly connected to an inlet hose of a closed fluid loop (not shown). The outlet 510 may be connected to an outlet hose of the closed fluid loop via the hollow connector section 502A. The first hollow piston 504 includes a first hollow-head section 504B or a sleeve. The second hollow piston 506 includes a second hollow-rod section 506A and a second hollow-head section 506B extending from the second hollow-rod section 506A. The second hollow piston 506 may reciprocate within the cylinder 502 and the hollow connector section 502A. The first hollow piston 504 may reciprocate relative to the second hollow-rod section 506A of the second hollow piston 506. The first volume portion 514 is defined between the second hollow-head section 506B and the inlet 508. The second volume portion 518 is defined between the first hollow-head section 504B and the second hollow-head section 506B of the cylinder 502. The third volume portion 522 is defined between the first hollow-head section 504B and the outlet 510 of the cylinder 502.

In one or more examples, the first volume portion 514 may be filled with a cooling fluid, and the second volume portion 518 may be filled with a driver fluid, and the third volume portion 522 may be filled with a compressible matter 524, e.g., spring. In such examples, the first volume portion 514 may be fluidically connected to the closed fluid loop via the first hollow piston 504, the second hollow piston 506, and the hollow connector section 502A. Accordingly, the cooling fluid filled in the first volume portion 514 may flow continuously in the closed fluid loop, thereby preventing stagnation of the cooling fluid within the first volume portion 514 of the pressure regulator assembly 500. The cylinder 502 further includes a first opening 534 formed on a section of the cylinder 502 that corresponds to the second volume portion 518. In such examples, a driver fluid assembly (not shown) of the pressure regulator assembly 500 may be connected to the second volume portion 518 via the first opening 534.

In one or more examples, the first hollow piston 504 may reciprocate i) upon expansion of the compressible matter 524 to push a portion of the cooling fluid from the first volume portion 514 into the closed fluid loop and ii) upon compression of the compressible matter 524 to pull the portion of the cooling fluid from the closed fluid loop into the first volume portion 514, to maintain the operating pressure of the cooling fluid in the closed fluid loop. In the example implementation, the compressible matter 524 may push the second hollow piston 506 along a second direction 20 via the first hollow piston 504 and the driver fluid to push the portion of the cooling fluid from the first volume portion 514 into the closed fluid loop. Similarly, the compressible matter 524 may be compressed by the slidable movement of the first hollow piston 504 along a first direction 10 caused by the portion of the cooling fluid pushed into the first volume portion 514 from the closed fluid loop. In some examples, the portion of the cooling fluid pushed into the first volume portion 514 may indirectly compress the compressible matter 524 via the second hollow piston 506, the driver fluid, and the first hollow piston 504. Accordingly, the pressure regulator assembly 500 may handle the pressure spikes and/or thermal expansion and contraction of the cooling fluid in the closed fluid loop.

Further, the second hollow piston 506 may be slidably driven along the second direction 20 by the driver fluid in response to a predefined pressure drop of the cooling fluid in the closed fluid loop during a predefined time period. In some examples, the driver fluid is pumped into the second volume portion 518 via the first opening 534 to drive the second hollow piston 506 along the second direction 20 and reduce the first volume portion 514. Accordingly, the reduction of the first volume portion 514 may result in injecting a portion of the cooling fluid from the first volume portion 514 into the closed fluid loop to make up for the loss of the cooling fluid in a CDU, and thereby restoring the operating pressure of the cooling fluid in the closed fluid loop. Additionally, the driver fluid pumped into the second volume portion 518 may slidably drive the first hollow piston 504 along the first direction 10 to compress the compressible matter and restore the compressible matter in the third volume portion 522 to the operating pressure.

FIG. 6 is a flowchart depicting a method 600 of operating a pressure regulator assembly for managing the operating pressure of a cooling fluid in a closed fluid loop of a CDU and regulating a loss of the cooling fluid in the CDU to restore the operating pressure of the cooling fluid in the closed fluid loop. It should be noted herein that the method 600 is described in conjunction with FIGS. 2A-2C, for example. The method 600 starts at block 602 and continues to block 604.

At block 604, the method 600 includes directing a flow of the cooling fluid in the closed fluid loop of the CDU via the pressure regulator assembly including a cylinder having an internal volume, and a first hollow piston and a second hollow piston slidably connected to the cylinder to split the internal volume into a first volume portion having the cooling fluid, a second volume portion having a driver fluid, and a third volume portion having a compressible matter. In such examples, the first volume portion is fluidically connected to the closed fluid loop via the first and second hollow pistons to allow a continuous flow of the cooling fluid to the closed fluid loop via the cooling fluid reservoir. Since the cooling fluid filled in the internal volume (i.e., first volume portion) of the cooling fluid reservoir flows continuously, stagnation of the cooling fluid may not occur in the pressure regulator assembly. Accordingly, the pressure regulator assembly of the present disclosure may overcome one or more problems associated with the stagnation of the cooling fluid stored in the existing fluid reservoir. The method 600 continues to block 606.

At block 606, the method 600 includes reciprocating the first hollow piston by the compressible matter to maintain an operating pressure of the cooling fluid in the closed fluid loop. In some examples, reciprocating the first hollow piston includes sliding the first hollow piston upon expansion of the compressible matter to push a portion of the cooling fluid from the first volume portion into the closed fluid loop and sliding the first hollow piston upon compression of the compressible matter to pull the portion of the cooling fluid from the closed fluid loop into the first volume portion, to maintain the operating pressure. Accordingly, the pressure regulator assembly may handle the pressure spikes and/or thermal expansion and contraction of the cooling fluid in the closed fluid loop. The method 600 continues to block 608.

At block 608, the method 600 includes detecting a predefined pressure drop of the cooling fluid in the closed fluid loop during a predefined time period. In some examples, the CDU may include a sensor, e.g., a pressure sensor located at a pump-inlet of a circulation pump that is connected to the closed fluid loop, to detect the predefined pressure drop of the cooling fluid at the pump inlet. In such examples, the pressure sensor may periodically detect the operating pressure of the cooling fluid at the pump-inlet, and generate signals during the predefined time period. In some examples, the sensor may communicate the signals to a controller or a data center management server, which is communicatively coupled to the sensor. In one or more examples, the signals may be indicative of the operating pressure of the cooling fluid at the pump-inlet during the predefined time period.

In some examples, an administrator of the data center management server or the controller may compare the received pressure data with a stored pressure data to determine whether the received pressure data is equal to a predefined pressure (e.g., a minimum threshold pressure) during the predefined time period or the received pressure data is greater than the predefined pressure during the predefined time period. If the administrator or the controller determines that the received pressure data during the predefined time period is greater than the predefined pressure i.e., "no" at block 608, the method 600 ends at block 612. If the administrator or the controller determines that the received pressure data during the predefined time period is equal to the predefined pressure i.e., "yes" at block 608 than the method 600 may move to block 610.

At block 610, the method 600 includes driving the second hollow piston by the driver fluid in response to a predefined pressure drop of the cooling fluid in the closed fluid loop during a predefined time period, to inject an additional cooling fluid from the first volume portion into the closed fluid loop to restore a pressure level to the operating pressure. In some examples, the controller may send control signal to a driver fluid assembly to automatically drive the second hollow piston, as discussed in the example of FIG. 3. In some other examples, the administrator may manually regulate the driver fluid assembly to drive the second hollow piston. In some examples, at block 610, the method 600 may further include driving the first hollow piston by the driver fluid to simultaneously restore the compressible matter in the third volume portion to the operating pressure. Accordingly, the pressure regulator assembly may make up for the losses of the cooling fluid in the closed fluid loop of the CDU, and return the pressure levels of the cooling fluid in the closed fluid loop and the compressible matter in the third volume portion to the operating pressure. The method 600 ends at block 612.

Various features as illustrated in the examples described herein may be implemented in a pressure regulator assembly, which may function as a combined accumulator and cooling fluid reservoir. The pressure regulator assembly may simultaneously maintain the operating pressure of the cooling fluid in the closed fluid loop and restore the pressure level of the cooling fluid in the closed fluid loop to the operating pressure. Moreover, the pressure regulator assembly may be easier to handle, less expensive, and require less space for installation as compared to cooling systems requiring a separate accumulator and cooling fluid reservoir. Further, a system having electronic devices and the pressure regulator assembly may not be forced to separately undergo shut down for maintenance and/or replacement of an accumulator and a cooling fluid reservoir.

In the foregoing description, numerous details are set forth to provide an understanding of the subject matter disclosed herein. However, the implementation may be practiced without some or all of these details. Other implementations may include modifications, combinations, and variations from the details discussed above. It is intended that the following claims cover such modifications and variations.

What is claimed is:

1. A pressure regulator assembly, comprising:
a cylinder having an internal volume; and
a first hollow piston and a second hollow piston slidably connected to the cylinder to split the internal volume into a first volume portion having a cooling fluid, a second volume portion having a driver fluid, and a third volume portion having a compressible matter,
wherein the first volume portion is fluidically connected to a closed fluid loop of a coolant distribution unit (CDU), wherein the first hollow piston is reciprocated by the compressible matter to maintain an operating pressure of the cooling fluid in the closed fluid loop, wherein the second hollow piston is driven by the driver fluid in response to a predefined pressure drop of the cooling fluid in the closed fluid loop during a predefined time period to inject additional cooling fluid from the first volume portion into the closed fluid loop to restore a pressure level to the operating pressure, and wherein each of the cooling fluid and the driver fluid is a non-compressible fluid.

2. The pressure regulator assembly of claim 1, wherein the first hollow piston reciprocates: i) upon expansion of the compressible matter to push a portion of the cooling fluid from the first volume portion into the closed fluid loop and ii) upon compression of the compressible matter to pull the portion of the cooling fluid from the closed fluid loop into the first volume portion, to maintain the operating pressure.

3. The pressure regulator assembly of claim 1, wherein the first hollow piston is further driven by the driver fluid to compress the compressible matter to simultaneously restore the compressible matter in the third volume portion to the operating pressure.

4. The pressure regulator assembly of claim 3, wherein the second volume portion is fluidically connected to a driver fluid reservoir via a first opening in the cylinder, and wherein the driver fluid is pumped from the driver fluid reservoir into the second volume portion to: i) drive the second hollow piston to inject the additional cooling fluid from the first volume portion into the closed fluid loop, and ii) drive the first hollow piston to compress the compressible matter until the pressure level of the cooling fluid in the closed fluid loop and the compressible matter in the third volume portion are restored to the operating pressure.

5. The pressure regulator assembly of claim 1, wherein the first volume portion is fluidically connected to a supplementary cooling fluid reservoir via a second opening in the cylinder, and wherein a supplementary cooling fluid is pumped from the supplementary cooling fluid reservoir into the first volume portion in response to a minimum threshold volume level of the cooling fluid in the first volume portion, until a volume level of the cooling fluid and the supplementary cooling fluid in the first volume portion is increased to a predefined volume level from the minimum threshold volume level.

6. The pressure regulator assembly of claim 5, wherein the supplementary cooling fluid pumped into the first volume portion drives the second hollow piston to refill the first volume portion with the supplementary cooling fluid and drain a portion of the driver fluid from the second volume portion into a driver fluid reservoir fluidically connected to the second volume portion via a first opening in the cylinder.

7. The pressure regulator assembly of claim 1, wherein the cooling fluid is one of a mixture of water and propylene glycol with additives, a dielectric fluid, or water, wherein the driver fluid is one of a propylene glycol, a hydraulic fluid, water, or a mixture of water and propylene glycol, wherein the compressible matter is one of a compressible spring, an elastomer component, or a compressible fluid, wherein the operating pressure is a range from 10 pounds per square inch (psi) to 150 psi, wherein the predefined pressure drop is 10 percent of the operating pressure, wherein the predefined time period is 1 minute, wherein a minimum threshold volume level is 20 percent of the internal volume, and wherein a predefined volume level is 60 percent of the internal volume.

8. A coolant distribution unit (CDU) comprising:
a closed fluid loop;
a circulation pump connected to the closed fluid loop for pumping a cooling fluid in the closed fluid loop;

a sensor disposed at an inlet of the circulation pump to detect a predefined pressure drop of the cooling fluid in the closed fluid loop during a predefined time period; and a pressure regulator assembly comprising:
  a cylinder having an internal volume; and
  a first hollow piston and a second hollow piston slidably connected to the cylinder to split the internal volume into a first volume portion having the cooling fluid, a second volume portion having a driver fluid, and a third volume portion having a compressible matter, wherein the first volume portion is fluidically connected to the closed fluid loop to allow a continuous flow of the cooling fluid in the closed fluid loop via the pressure regulator assembly, wherein the first hollow piston is reciprocated by the compressible matter to maintain an operating pressure of the cooling fluid in the closed fluid loop, and wherein the second hollow piston is driven by the driver fluid in response to detection by the sensor of the predefined pressure drop of the cooling fluid in the closed fluid loop during the predefined time period to inject an additional cooling fluid from the first volume portion into the closed fluid loop to restore a pressure level to the operating pressure.

9. The CDU of claim 8, wherein the first hollow piston reciprocates: i) upon expansion of the compressible matter to push a portion of the cooling fluid from the first volume portion into the closed fluid loop and ii) upon compression of the compressible matter to pull the portion of the cooling fluid from the closed fluid loop into the first volume portion, to maintain the operating pressure.

10. The CDU of claim 8, wherein the first hollow piston is further driven by the driver fluid to compress the compressible matter to simultaneously restore the compressible matter in the third volume portion to the operating pressure.

11. The CDU of claim 10, wherein the second volume portion is fluidically connected to a driver fluid reservoir via a first opening in the cylinder, and wherein the driver fluid is pumped from the driver fluid reservoir into the second volume portion to: i) drive the second hollow piston to inject the additional cooling fluid from the first volume portion into the closed fluid loop, and ii) drive the first hollow piston to compress the compressible matter until the pressure level of the cooling fluid in the closed fluid loop and the compressible matter in the third volume portion are restored to the operating pressure.

12. The CDU of claim 8, further comprising a limit switch disposed on the cylinder, wherein the first volume portion is fluidically connected to a supplementary cooling fluid reservoir via a second opening in the cylinder, and wherein a supplementary cooling fluid is pumped from the supplementary cooling fluid reservoir into the first volume portion in response to detection, by the limit switch, of a minimum threshold volume level of the cooling fluid in the first volume portion, until a volume level of the cooling fluid and the supplementary cooling fluid in the first volume portion is increased to a predefined volume level from the minimum threshold volume level.

13. The CDU of claim 12, wherein the supplementary cooling fluid pumped into the first volume portion drives the second hollow piston to refill the first volume portion with the supplementary cooling fluid and drain a portion of the driver fluid from the second volume portion into a driver fluid reservoir fluidically connected to the second volume portion via a first opening in the cylinder.

14. The CDU of claim 8, wherein each of the cooling fluid and the driver fluid is a non-compressible fluid.

15. The CDU of claim 8, wherein the cooling fluid is one of a mixture of water and propylene glycol with additives, a dielectric fluid, or water, wherein the driver fluid is one of a propylene glycol, a hydraulic fluid, water, or a mixture of water and propylene glycol, wherein the compressible matter is one of a compressible spring, an elastomer component, or a compressible fluid, wherein the operating pressure is a range from 10 pounds per square inch (psi) to 150 psi, wherein the predefined pressure drop is 10 percent of the operating pressure, wherein the predefined time period is 1 minute, wherein a minimum threshold volume level is 20 percent of the internal volume, and wherein a predefined volume level is 60 percent of the internal volume.

16. The CDU of claim 8, wherein the pressure regulator assembly functions as a combined assembly of an accumulator and a cooling fluid reservoir.

17. A method comprising:
  directing a flow of a cooling fluid in a closed fluid loop of a coolant distribution unit (CDU) via a pressure regulator assembly comprising a cylinder having an internal volume, and a first hollow piston and a second hollow piston slidably connected to the cylinder to split the internal volume into a first volume portion having the cooling fluid, a second volume portion having a driver fluid, and a third volume portion having a compressible matter, wherein the first volume portion is fluidically connected to the closed fluid loop;
  reciprocating the first hollow piston by the compressible matter to maintain an operating pressure of the cooling fluid in the closed fluid loop; and
  driving the second hollow piston by the driver fluid in response to a predefined pressure drop of the cooling fluid in the closed fluid loop during a predefined time period, to inject an additional cooling fluid from the first volume portion into the closed fluid loop to restore a pressure level to the operating pressure, wherein each of the cooling fluid and the driver fluid is a non-compressible fluid.

18. The method of claim 17, wherein reciprocating the first hollow piston comprises:
  sliding the first hollow piston upon expansion of the compressible matter to push a portion of the cooling fluid from the first volume portion into the closed fluid loop; and
  sliding the first hollow piston upon compression of the compressible matter to pull the portion of the cooling fluid from the closed fluid loop into the first volume portion, to maintain the operating pressure.

19. The method of claim 17, further comprising driving the first hollow piston by the driver fluid to simultaneously restore the compressible matter in the third volume portion to the operating pressure.

20. The method of claim 17, wherein the cooling fluid is one of a mixture of water and propylene glycol with additives, a dielectric fluid, or water, wherein the driver fluid is one of a propylene glycol, a hydraulic fluid, water, or a mixture of water and propylene glycol, wherein the compressible matter is one of a compressible spring, an elastomer component, or a compressible fluid, wherein the operating pressure is a range from 10 pounds per square inch (psi) to 150 psi, wherein the predefined pressure drop is 10 percent of the operating pressure, wherein the predefined time period is 1 minute, wherein a minimum threshold volume level is 20 percent of the internal volume, and wherein a predefined volume level is 60 percent of the internal volume.

\* \* \* \* \*